(12) United States Patent
Sasajima et al.

(10) Patent No.: US 9,039,838 B2
(45) Date of Patent: May 26, 2015

(54) METHOD OF MANUFACTURING SEMICONDUCTOR DEVICE AND SUBSTRATE PROCESSING APPARATUS

(75) Inventors: Ryota Sasajima, Toyama (JP); Yoshiro Hirose, Toyama (JP); Yosuke Ota, Toyama (JP); Naonori Akae, Toyama (JP); Kojiro Yokozawa, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 525 days.

(21) Appl. No.: 13/553,968

(22) Filed: Jul. 20, 2012

(65) Prior Publication Data

US 2013/0019804 A1   Jan. 24, 2013

Related U.S. Application Data

(63) Continuation of application No. 12/949,256, filed on Nov. 18, 2010, now Pat. No. 8,252,701.

(30) Foreign Application Priority Data

Nov. 20, 2009 (JP) ................................. 2009-265432
Sep. 27, 2010 (JP) ................................. 2010-215398

(51) Int. Cl.
  *C23C 16/54* (2006.01)
  *C23C 16/56* (2006.01)
  (Continued)

(52) U.S. Cl.
  CPC .......... *H01L 21/02164* (2013.01); *C23C 16/54* (2013.01); *C23C 16/402* (2013.01);
  (Continued)

(58) Field of Classification Search
  CPC ................... H01L 21/02164; H01L 21/02186;
  H01L 21/02189; H01L 21/02337; H01L 21/02181; H01L 21/0228; H01L 21/3141; H01L 21/31645; H01L 21/31608; C32C 16/56; C32C 16/402; C32C 21/31645; C32C 21/31608; C32C 16/45546
  USPC .................. 438/770, 773, 774; 257/E21.282
  See application file for complete search history.

(56) References Cited

U.S. PATENT DOCUMENTS 6,313,047 B2   11/2001   Hasebe et al.
6,551,873 B2   4/2003    Park et al.
(Continued)

FOREIGN PATENT DOCUMENTS

| JP | 10-223397 | * | 8/1998 |
| JP | 2001-237242 A | | 8/2001 |

(Continued)

*Primary Examiner* — Jeffrie R Lund
(74) *Attorney, Agent, or Firm* — Volpe and Koenig, P.C.

(57) ABSTRACT

Provided is a substrate processing apparatus. The apparatus includes: a process vessel, a heater, a source gas supply system, an oxygen-containing gas supply system, a hydrogen-containing gas supply system, a pressure regulator, and a controller. The controller is configured to control the parts so as to perform: (a) forming an oxide film on a substrate by alternately repeating: (a-1) forming a layer by supplying a source gas into the process vessel accommodating the substrate; and (a-2) changing the layer into an oxide layer by supplying an oxygen-containing gas and an hydrogen-containing gas into the process vessel, the inside of the process vessel being under a heated atmosphere having a low pressure; and (b) modifying the oxide film formed on the substrate by supplying the oxygen-containing gas and the hydrogen-containing gas into the process vessel, the inside of the process vessel being under the heated atmosphere having the low pressure.

10 Claims, 9 Drawing Sheets

(51) Int. Cl.
*H01L 21/02* (2006.01)
*C23C 16/40* (2006.01)
*C23C 16/455* (2006.01)
*H01L 21/314* (2006.01)
*H01L 21/316* (2006.01)

(52) U.S. Cl.
CPC ........... *C23C16/45546* (2013.01); *C23C 16/56* (2013.01); *H01L 21/02181* (2013.01); *H01L 21/02186* (2013.01); *H01L 21/02189* (2013.01); *H01L 21/0228* (2013.01); *H01L 21/02337* (2013.01); *H01L 21/3141* (2013.01); *H01L 21/31608* (2013.01); *H01L 21/31645* (2013.01)

(56) References Cited

U.S. PATENT DOCUMENTS

| | | | |
|---|---|---|---|
| 7,220,461 B2 | 5/2007 | Hasebe et al. | |
| 7,651,730 B2 | 1/2010 | Hasebe | |
| 7,754,293 B2 | 7/2010 | Aoyama et al. | |
| 8,252,701 B2 * | 8/2012 | Sasajima et al. | 438/774 |
| 8,367,557 B2 * | 2/2013 | Akae et al. | 438/770 |
| 8,557,716 B2 * | 10/2013 | Mizuno | 438/770 |
| 2010/0210118 A1 * | 8/2010 | Mizuno | 438/770 |
| 2010/0270626 A1 | 10/2010 | Raisanen | |
| 2011/0130011 A1 * | 6/2011 | Sasajima et al. | 438/770 |
| 2013/0019804 A1 * | 1/2013 | Sasajima et al. | 118/725 |
| 2013/0252434 A1 * | 9/2013 | Yuasa et al. | 438/758 |
| 2014/0318451 A1 * | 10/2014 | Akae et al. | 118/706 |

FOREIGN PATENT DOCUMENTS

| | | |
|---|---|---|
| JP | 2001-338922 | 12/2001 |
| JP | 2004296887 A | 10/2004 |
| JP | 2005-123275 | 5/2005 |
| JP | 2005303074 A | 10/2005 |
| JP | 2006-054432 | 2/2006 |
| JP | 2009-021526 | 1/2009 |
| JP | 2009-188349 | 8/2009 |
| KR | 10-2008-0049853 | 6/2008 |
| KR | 10-2009-0071391 | 7/2009 |
| TW | 201120956 A | 6/2011 |
| WO | 2007/083651 A1 | 7/2007 |
| WO | 2009/099252 A1 | 8/2009 |

* cited by examiner

METHOD OF MANUFACTURING SEMICONDUCTOR DEVICE AND SUBSTRATE PROCESSING APPARATUS

CROSS-REFERENCE TO RELATED PATENT APPLICATION

This U.S. non-provisional patent application claims priority under 35 U.S.C. §119 of Japanese Patent Application No. 2009-265432, filed on Nov. 20, 2009, and No. 2010-215398, filed on Sep. 27, 2010, in the Japanese Patent Office, the entire contents of which are hereby incorporated by reference.

BACKGROUND OF THE INVENTION

1. Field of the Invention

The present invention relates to a method of manufacturing a semiconductor device, the method including a process of forming a thin film on a substrate, and a substrate processing apparatus suitable for the process.

2. Description of the Related Art

In one of processes of manufacturing a semiconductor device, a silicon oxide film or a metal oxide film (hereinafter, such films will be collectively referred to as oxide films) is formed by a chemical vapor deposition (CVD) method or an atomic layer deposition (ALD) method. Generally, it is known that electric characteristics of a semiconductor device are improved when films of the semiconductor device are formed at high temperatures. The reason for this may be that the concentrations of impurities of the films are reduced and the quality of the film is improved if the films are formed at high temperatures. For example, there is a method of forming a silicon oxide film (high temperature oxide (HTO) film) at a high temperature of about 800° C. by a CVD method using an inorganic material such as $SiH_2Cl_2$ gas and $N_2O$ gas (e.g., refer to Patent Document 1).

[Patent Document 1] Japanese Unexamined Patent Application Publication No. 2001-85333

However, when a silicon oxide film or a metal oxide film is formed by a CVD or ALD method, a source gas such as a silicon source may undergo self-reaction at a higher temperature to generate a contaminant, or HCl or $Cl_2$ generated from the source gas may act as an etchant to deteriorate film thickness uniformity. Therefore, it may be difficult to form a silicon oxide film or a metal oxide film at a higher temperature by a CVD or ALD method.

There is a method of forming an oxide film by diffusion such as a dry oxidation method or a wet oxidation method. However, as size reduction proceeds, if an oxide film is formed by diffusion, a material (for example, silicon) lying under the oxide film is consumed while the oxide film is formed. Therefore, it may be improper to use a diffusion method to form an oxide film in a small region.

SUMMARY OF THE INVENTION

An object of the present invention is to provide a method of manufacturing a semiconductor device and a substrate processing apparatus that are designed to improve the quality of an oxide film while avoiding risks of a high temperature oxide film forming process, and thus to improve electric characteristics of a semiconductor device. Another object of the present invention is to provide a method of manufacturing a semiconductor device and a substrate processing apparatus that are designed to minimize consumption of an under-layer material when an oxide film is formed, so as to make the oxide film suitable for constructing a fine structure.

According to an aspect of the present invention, there is provided a method of manufacturing a semiconductor device, including:

(a) forming an oxide film having a predetermined thickness on a substrate by alternately repeating: (a-1) forming a layer containing a predetermined element on the substrate by supplying a source gas containing the predetermined element into a process vessel accommodating the substrate and exhausting the source gas from the process vessel; and (a-2) changing the layer containing the predetermined element into an oxide layer by supplying an oxygen-containing gas and an hydrogen-containing gas into the process vessel, wherein an inside of the process vessel is under a heated atmosphere having a pressure lower than an atmospheric pressure, and exhausting the oxygen-containing gas and the hydrogen-containing gas from the process vessel; and (b) modifying the oxide film formed on the substrate by supplying the oxygen-containing gas and the hydrogen-containing gas into the process vessel, wherein the inside of the process vessel is under the heated atmosphere having the pressure lower than the atmospheric pressure, and exhausting the oxygen-containing gas and the hydrogen-containing gas from the process vessel.

According to another aspect of the present invention, there is provided a substrate processing apparatus including:

a process vessel configured to accommodate a substrate;

a heater configured to heat an inside of the process vessel;

a source gas supply system configured to supply a source gas containing a predetermined element into the process vessel;

an oxygen-containing gas supply system configured to supply an oxygen-containing gas into the process vessel;

a hydrogen-containing gas supply system configured to supply a hydrogen-containing gas into the process vessel;

an exhaust system configured to exhaust the inside of the process vessel;

a pressure regulator configured to control pressure of the inside of the process vessel; and a controller configured to control the heater, the source gas supply system, the oxygen-containing gas supply system, the hydrogen-containing gas supply system, the exhaust system, and the pressure regulator so as to perform:

(a) forming an oxide film having a predetermined thickness on the substrate by alternately repeating: (a-1) forming a layer containing the predetermined element on the substrate by supplying the source gas into a process vessel accommodating the substrate and exhausting the source gas from the process vessel; and (a-2) changing the layer containing the predetermined element into an oxide layer by supplying an oxygen-containing gas and an hydrogen-containing gas into the process vessel, wherein the inside of the process vessel is under a heated atmosphere having a pressure lower than an atmospheric pressure, and exhausting the oxygen-containing gas and the hydrogen-containing gas from the process vessel; and (b) modifying the oxide film formed on the substrate by supplying the oxygen-containing gas and the hydrogen-containing gas into the process vessel, wherein the process vessel is under the heated atmosphere having the pressure lower than the atmospheric pressure, and exhausting the oxygen-containing gas and the hydrogen-containing gas from the process vessel.

DETAILED DESCRIPTION OF THE PREFERRED EMBODIMENTS

Figure 1:
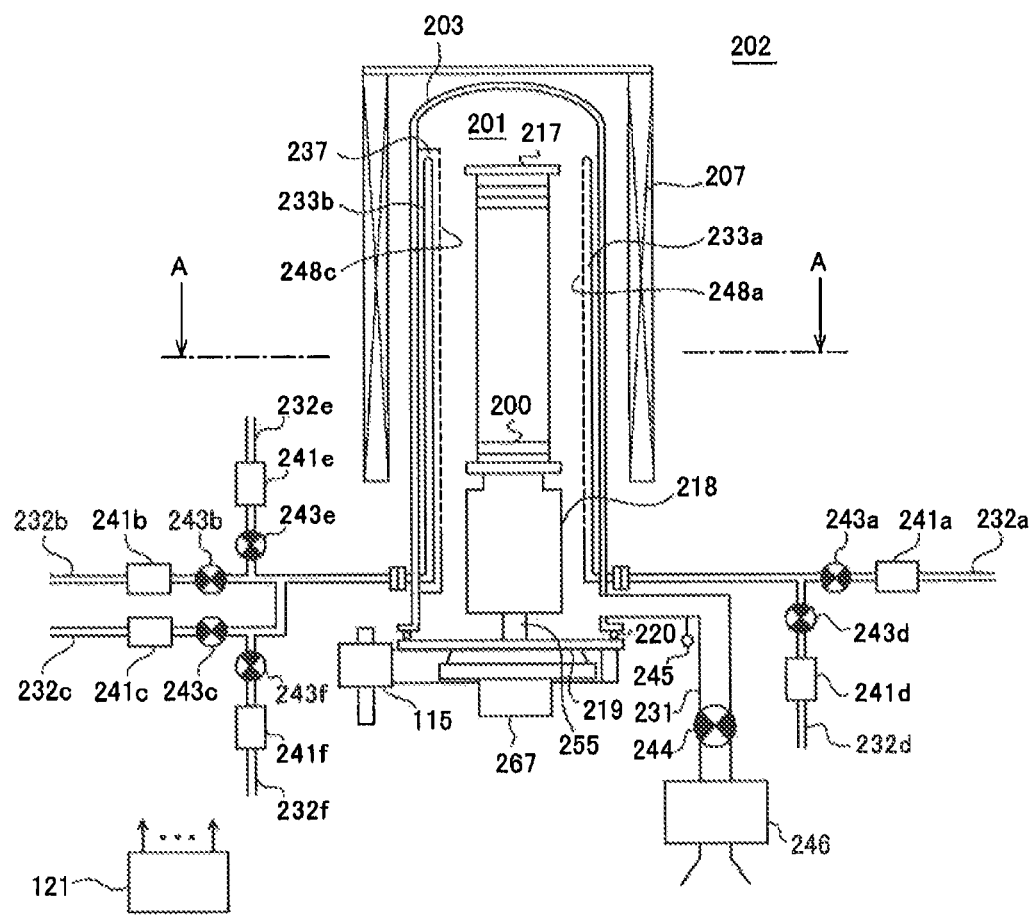
FIG. 1 is a schematic view illustrating a vertical process furnace of a substrate processing apparatus that can be suitably used according to an embodiment of the present invention, FIG. 1 illustrating a vertical sectional view of the process furnace.

The inventors have studied a method of forming an oxide film such as a silicon oxide film or a metal oxide film at a relatively low temperature to avoid risks of a high temperature film-forming process and then performing a predetermined modification treatment to the oxide film. As a result, the inventors have found the following fact. After performing a process of forming an oxide film on a substrate, if a modification process is performed to the oxide film formed on the substrate by supplying an oxygen-containing gas and a hydrogen-containing gas to the oxide film of the substrate under a heated atmosphere kept at a pressure lower than an atmospheric pressure, impurities of the oxide film can be largely reduced, and the quality of the oxide film can be significantly improved. In addition, it has been found that when the oxide film is formed, consumption of an under-layer material can be minimized to make the oxide film suitable for constructing a fine structure.

In the oxide film forming process, an oxide film such as a silicon oxide film or a metal oxide film may be formed by a chemical vapor deposition (CVD) method. Alternatively, an oxide film may be formed by an atomic layer deposition (ALD) method. In an embodiment of the present invention, an oxide film having a predetermined thickness is formed on a substrate by alternately repeating: a process of forming a layer containing a predetermined element on the substrate by supplying a source gas containing the predetermined element into a process vessel where the substrate is accommodated and exhausting the source gas from the process vessel; and a process of changing the layer containing the predetermined element into an oxide layer by supplying an oxygen-containing gas and a hydrogen-containing gas into the process vessel which is heated and kept at a pressure lower than atmospheric pressure and exhausting the oxygen-containing gas and the hydrogen-containing gas from the process vessel. For example, the predetermined element may be a semiconductor element such as silicon (Si), or a metal element such as zirconium (Zr), hafnium (Hf), titanium (Ti), or aluminium (Al).

In the oxide film forming process, the process of forming the layer containing the predetermined element is performed in a condition where a CVD reaction can be caused. At this time, a predetermined element layer is formed as the layer containing the predetermined element constituted by less than one atomic layer to several atomic layers. The layer containing the predetermined element may be an adsorption layer of the source gas containing the predetermined element (hereinafter simply referred to as a source gas). The predetermined element layer is a general term used to denote a layer made of the predetermined element, such as a continuous layer, a discontinuous layer, and a thin film in which such layers are overlapped. In addition, a continuous layer made of the predetermined element may also be called "a thin film." In addition, the adsorption layer of the source gas is a term including a continuous chemical adsorption layer formed by chemical adsorption of molecules of the source gas and a discontinuous chemical adsorption layer formed by chemical adsorption of molecules of the source gas. Furthermore, the expression "a layer less than one atomic layer" is used to denote a discontinuous atomic layer. In a condition where the source gas decomposes by itself, the predetermined element layer is formed on the substrate by deposition of the predetermined element on the substrate. In a condition where the source gas does not decompose by itself, a source gas adsorption layer is formed on the substrate by adsorption of the source gas on the substrate. The former case where the predetermined element layer is formed on the substrate is more preferable than the latter case where the source gas adsorption layer is formed on the substrate because the film-forming rate of the former case is higher than that of the latter case.

In the oxide film film-forming process, the process of changing the layer containing the predetermined element into the oxide layer is performed by generating an oxidizing species containing oxygen by reaction between the oxygen-containing gas and the hydrogen-containing gas in the process vessel which is heated and kept at a pressure lower than atmospheric pressure and oxidizing (changing) the layer containing the predetermined element into the oxide layer by using the oxidizing species. By this oxidizing treatment, oxidizing power can be largely increased as compared with the case where only an oxygen-containing gas is supplied. That is, by adding a hydrogen-containing gas to an oxygen-containing gas under a depressurized atmosphere, oxidizing power can be largely increased as compared with the case where only an oxygen-containing gas is supplied. The process of changing the layer containing the predetermined element into the oxide layer can be performed under a depressurized atmosphere without using plasma. Alternatively, in the process of changing the layer containing the predetermined element into the oxide layer, one or both of the oxygen-containing gas and the hydrogen-containing gas may be activated by plasma.

The oxide film having a predetermined thickness is formed on the substrate by alternately repeating: the process of forming the layer containing the predetermined element, and the process of changing the layer containing the predetermined element into the oxide layer. Next, the oxide film having a predetermined thickness is modified. In a process of modifying the oxide film having a predetermined thickness, an oxygen-containing gas and a hydrogen-containing gas are allowed to react with each other in the process vessel which is heated and kept at a pressure lower than atmospheric pressure to generate an oxidizing species containing oxygen, and the oxide film is modified by using the oxidizing species. By this modification treatment, impurities included in the oxide film can be largely reduced as compared with the case where only an oxygen-containing gas is supplied. That is, it was found that the effect of removing impurities from a film was largely improved by adding a hydrogen-containing gas to an oxygen-containing gas under a depressurized atmosphere as compared with the case where only an oxygen-containing gas was supplied. In addition, by this modification treatment, impurities included in the oxide film can be largely reduced as compared with the case where only $N_2$ gas is supplied, that is, the case where $N_2$ annealing is performed. Therefore, electric characteristics of the oxide film can be improved. The process of modifying the oxide film can be performed under a depressurized atmosphere without using plasma. Alternatively, in the process of modifying the oxide film, one or both of the oxygen-containing gas and the hydrogen-containing gas may be activated by plasma.

The present invention is provided based on the knowledge of the inventors. Hereinafter, an embodiment of the present invention will now be described with reference to the attached drawings.

Figure 2:
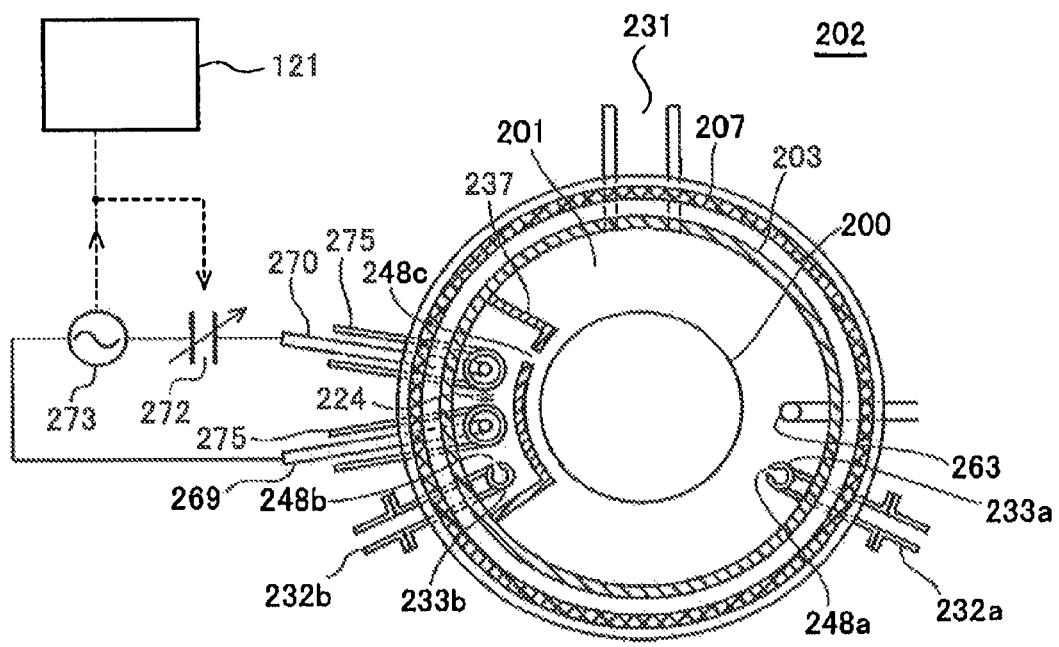
FIG. 2 is a sectional view taken along line A-A of FIG. 1 for schematically illustrating the vertical process furnace according to the embodiment of the present invention.

FIG. 1 is a schematic view illustrating a vertical process furnace 202 of a substrate processing apparatus that can be suitably used according to an embodiment of the present invention, FIG. 1 illustrating a vertical sectional view of the process furnace 202. FIG. 2 is a sectional view taken along line A-A of FIG. 1 for schematically illustrating the vertical process furnace 202 according to the embodiment of the present invention. However, the present invention is not limited to the substrate processing apparatus of the current embodiment. For example, the present invention can be applied to other substrate processing apparatuses such as a substrate processing apparatus having a single-wafer type, hot wall type, or cold wall type process furnace.

As shown in FIG. 1, the process furnace 202 includes a heater 207 as a heating unit (heating mechanism). The heater 207 has a cylindrical shape and is vertically installed in a state where the heater 207 is supported on a heater base (not shown) which is a holding plate. As described later, the heater 207 is also used as an activation mechanism for activating gas by heat.

Inside the heater 207, a reaction tube 203 constituting a reaction vessel (process vessel) is installed concentrically with the heater 207. The reaction tube 203 is made of a heat-resistant material such as a quartz ($SiO_2$) or silicon carbide (SiC) and has a cylindrical shape with a closed top side and an opened bottom side. The hollow part of the reaction tube 203 forms a process chamber 201 and is configured to accommodate substrates such as wafers 200 by using a boat 217 (described later) in a manner such that the wafers 200 are horizontally positioned and vertically arranged in multiple stages.

At the lower part of the reaction tube 203 in the process chamber 201, a first nozzle 233a as a first gas introducing part, and a second nozzle 233b as a second gas introducing part are installed through the reaction tube 203. A first gas supply pipe 232a and a second gas supply pipe 232b are connected to the first nozzle 233a and the second nozzle 233b, respectively. In addition, a third gas supply pipe 232c is connected to the second gas supply pipe 232b. In this way, at the reaction tube 203, two nozzles 233a and 233b, and three gas supply pipes 232a, 232b, and 232c, are installed, and it is configured such that a plurality of kinds of gases, here, three kinds of gases, can be supplied into the process chamber 201.

At the first gas supply pipe 232a, a flow rate controller (flow rate control unit) such as a mass flow controller (MFC) 241a, and an on-off valve such as a valve 243a are sequentially installed from the upstream side of the first gas supply pipe 232a. In addition, a first inert gas supply pipe 232d is connected to the downstream side of the valve 243a of the first gas supply pipe 232a. At the first inert gas supply pipe 232d, a flow rate controller (flow rate control unit) such as a mass flow controller 241d, and an on-off valve such as a valve 243d are sequentially installed from the upstream side of the first inert gas supply pipe 232d. In addition, the first nozzle 233a is connected to the tip of the first gas supply pipe 232a. In an arc-shaped space between the inner wall of the reaction tube 203 and the wafers 200, the first nozzle 233a is erected in a manner such that the first nozzle 233a extends upward from the lower side to the upper side along the inner wall of the reaction tube 203 in a direction in which the wafers 200 are stacked. That is, the first nozzle 233a is installed at a side of a wafer arrangement region where wafers 200 are arranged. The first nozzle 233a is an L-shaped long nozzle. Gas supply holes 248a are formed through the lateral surface of the first nozzle 233a. The gas supply holes 248a are formed toward the centerline of the reaction tube 203 so that gas can be supplied toward the wafers 200 through the gas supply holes 248a. The gas supply holes 248a are formed at a plurality of positions along the lower side to the upper side of the reaction tube 203, and the gas supply holes 248a have the same size and are arranged at the same pitch.

A first gas supply system is constituted mainly by the first gas supply pipe 232a, the mass flow controller 241a, and the valve 243a. The first nozzle 233a may be included in the first gas supply system. In addition, a first inert gas supply system is constituted mainly by the first inert gas supply pipe 232d, the mass flow controller 241d, and the valve 243d. The first inert gas supply system functions as a purge gas supply system.

At the second gas supply pipe 232b, a flow rate controller (flow rate control unit) such as a mass flow controller (MFC) 241b, and an on-off valve such as a valve 243b are sequentially installed from the upstream side of the second gas supply pipe 232b. In addition, a second inert gas supply pipe 232e is connected to the downstream side of the valve 243b of the second gas supply pipe 232b. At the second inert gas supply pipe 232e, a flow rate controller (flow rate control unit) such as a mass flow controller 241e, and an on-off valve such as a valve 243e are sequentially installed from the upstream side of the second inert gas supply pipe 232e. In addition, the second nozzle 233b is connected to the tip of the second gas supply pipe 232b. The second nozzle 233b is installed in a buffer chamber 237 forming a gas diffusion space.

The buffer chamber 237 is installed in an arc-shaped space between the reaction tube 203 and the wafers 200 in a manner such that the buffer chamber 237 is located from the lower side to the upper side of the inner wall of the reaction tube 203 in a direction in which the wafers 200 are stacked. That is, the buffer chamber 237 is installed at a side of the wafer arrangement region. At an end of a wall of the buffer chamber 237 adjacent to the wafers 200, gas supply holes 248c are formed to supply gas therethrough. The gas supply holes 248c are formed toward the centerline of the reaction tube 203 so that gas can be supplied toward the wafers 200 through the gas supply holes 248c. The gas supply holes 248c are formed at a plurality of positions along the lower side to the upper side of the reaction tube 203, and the gas supply holes 248c have the same size and are arranged at the same pitch.

The second nozzle 233b is installed in the buffer chamber 237 at an end opposite to the end where the gas supply holes 248c are formed, in a manner such that the second nozzle 233b is erected upward along the lower side to the upper side of the inner wall of the reaction tube 203 in a direction in which the wafers 200 are stacked. That is, the second nozzle 233b is installed at a side of the wafer arrangement region. The second nozzle 233b is an L-shaped long nozzle. Gas supply holes 248b are formed through the lateral surface of the second nozzle 233b. The gas supply holes 248b are opened toward the centerline of the buffer chamber 237. Like the gas supply holes 248c of the buffer chamber 237, the gas supply holes 248b are formed at a plurality of positions along the lower side to the upper side of the reaction tube 203. If there is a small pressure difference between the inside of the buffer chamber 237 and the inside of the process chamber 201, it may be configured such that the gas supply holes 248b have the same size and are arranged at the same pitch from the upstream side (lower side) to the downstream side (upper side); however if the pressure difference is large, it may be configured such that the size of the gas supply holes 248b increases or the pitch of the gas supply holes 248b decreases as it goes from the upstream side to the downstream side.

In the current embodiment, since the size or pitch of the gas supply holes 248b of the second nozzle 233b is adjusted from the upstream side to the downstream side as described above, although the velocities of gas streams injected through the gas supply holes 248b are different, the flow rates of the gas streams injected through the gas supply holes 248b can be approximately equal. Gas streams injected through the respective gas supply holes 248b are first introduced into the buffer chamber 237 so as to reduce the velocity difference of the gas streams. That is, gas injected into the buffer chamber 237 through the gas supply holes 248b of the second nozzle 233b is reduced in particle velocity and is then injected from the buffer chamber 237 to the inside of the process chamber 201 through the gas supply holes 248c of the buffer chamber 237. Owing to this structure, when gas injected into the buffer chamber 237 through the gas supply holes 248b of the second nozzle 233b is injected into the process chamber 201 through the gas supply holes 248c of the buffer chamber 237, the flow rate and velocity of the gas can be uniform.

A second gas supply system is constituted mainly by the second gas supply pipe 232b, the mass flow controller 241b, and the valve 243b. The second nozzle 233b and the buffer chamber 237 may be included in the second gas supply system. In addition, a second inert gas supply system is constituted mainly by the second inert gas supply pipe 232e, the mass flow controller 241e, and the valve 243e. The second inert gas supply system functions as a purge gas supply system.

At the third gas supply pipe 232c, a flow rate controller (flow rate control unit) such as a mass flow controller (MFC) 241c, and an on-off valve such as a valve 243c are sequentially installed from the upstream side of the third gas supply pipe 232c. In addition, a third inert gas supply pipe 232f is connected to the downstream side of the valve 243c of the third gas supply pipe 232c. At the third inert gas supply pipe 232f, a flow rate controller (flow rate control unit) such as a mass flow controller 241f, and an on-off valve such as a valve 243f are sequentially installed from the upstream side of the third inert gas supply pipe 232f. In addition, the tip of the third gas supply pipe 232c is connected to the downstream side of the valve 243b of the second gas supply pipe 232b.

A third gas supply system is constituted mainly by the third gas supply pipe 232c, the mass flow controller 241c, and the valve 243c. A part of the second nozzle 233b and the buffer chamber 237 that are located at the downstream side of a junction part between the second gas supply pipe 232b and the third gas supply pipe 232c may be included in the third gas supply system. In addition, a third inert gas supply system is constituted mainly by the third inert gas supply pipe 232f, the mass flow controller 241f, and the valve 243f. The third inert gas supply system functions as a purge gas supply system.

A source gas containing a predetermined element, that is, a source gas containing silicon (Si) as the predetermined element (silicon-containing gas) such as hexachlorodisilane ($Si_2Cl_6$, abbreviation: HCD) is supplied from the first gas supply pipe 232a into the process chamber 201 through the mass flow controller 241a, the valve 243a, and the first nozzle 233a. That is, the first gas supply system is configured as a source gas supply system (silicon-containing gas supply system). At this time, inert gas may be supplied from the first inert gas supply pipe 232d into the first gas supply pipe 232a through the mass flow controller 241d and the valve 243d.

Gas containing oxygen (oxygen-containing gas) such as oxygen ($O_2$) gas is supplied from the second gas supply pipe 232b into the process chamber 201 through the mass flow controller 241b, the valve 243b, the second nozzle 233b, and the buffer chamber 237. That is, the second gas supply system is configured as an oxygen-containing gas supply system. At this time, inert gas may be supplied from the second inert gas supply pipe 232e into the second gas supply pipe 232b through the mass flow controller 241e and the valve 243e.

Gas containing hydrogen (hydrogen-containing gas) such as hydrogen ($H_2$) gas is supplied from the third gas supply pipe 232c into the process chamber 201 through the mass flow controller 241c, the valve 243c, the second gas supply pipe 232b, the second nozzle 233b, and the buffer chamber 237. That is, the third gas supply system is configured as a hydrogen-containing gas supply system. At this time, inert gas may be supplied from the third inert gas supply pipe 232f into the third gas supply pipe 232c through the mass flow controller 241f and the valve 243f.

In the current embodiment, $O_2$ gas and $H_2$ gas are supplied into the process chamber 201 (buffer chamber 237) through the same nozzle. However, for example, $O_2$ gas and $H_2$ gas may be supplied into the process chamber 201 through the different nozzles. However, if a plurality of kinds of gases are supplied through the same nozzle, many merits can be obtained. For example, fewer nozzles may be used to reduce apparatus costs, and maintenance works may be easily carried out. For example, if $O_2$ gas and $H_2$ gas are supplied into the process chamber 201 through different nozzles, HCD gas may be supplied into the process chamber 201 through the same nozzle as that used to supply the $H_2$ gas. In a film-forming temperature range (described later), HCD gas and $O_2$ gas may react with each other although HCD gas and $H_2$ gas do not react with each other. Therefore, it may be preferable that HCD gas and $O_2$ gas are supplied into the process chamber 201 through different nozzles.

Inside the buffer chamber 237, as shown in FIG. 2, a first rod-shaped electrode 269 which is a first electrode having a long slender shape, and a second rod-shaped electrode 270 which is a second electrode having a long slender shape are installed in a manner such that the first and second rod-shaped electrodes 269 and 270 extend from the lower side to the upper side of the reaction tube 203 in a direction in which wafers 200 are stacked. Each of the first and second rod-shaped electrodes 269 and 270 is parallel with the second nozzle 233b. The first and second rod-shaped electrodes 269 and 270 are respectively protected by electrode protection pipes 275 which cover the first and second rod-shaped electrodes 269 and 270 from the upper parts to the lower parts thereof. One of the first and second rod-shaped electrodes 269 and 270 is connected to a high-frequency power source 273 through a matching device 272, and the other is grounded to the earth (reference potential). Therefore, plasma can be generated in a plasma generation region 224 between the first and second rod-shaped electrodes 269 and 270. A plasma source, which is a plasma generator (plasma generating unit), is constituted mainly by the first rod-shaped electrode 269, the second rod-shaped electrode 270, the electrode protection pipes 275, the matching device 272, and the high-frequency power source 273. The plasma source is used as an activation mechanism for activating gas by using plasma.

The electrode protection pipes 275 are configured such that the first and second rod-shaped electrodes 269 and 270 can be inserted into the buffer chamber 237 in a state where the first and second rod-shaped electrodes 269 and 270 are respectively isolated from the atmosphere of the buffer chamber 237. If the insides of the electrode protection pipes 275 have the same atmosphere as the outside air (atmosphere), the first and second rod-shaped electrodes 269 and 270 that are respectively inserted in the electrode protection pipes 275 may be oxidized due to heat emitted from the heater 207. Therefore, an inert gas purge mechanism is installed to prevent oxidation of the first rod-shaped electrode 269 or the second rod-shaped electrode 270 by filling or purging the insides of the electrode protection pipes 275 with inert gas such as nitrogen to maintain the oxygen concentration of the insides of the electrode protection pipes 275 at a sufficiently low level.

At the reaction tube 203, an exhaust pipe 231 is installed to exhaust the inside atmosphere of the process chamber 201. A vacuum pump 246 which is a vacuum exhaust device is connected to the exhaust pipe 231 through a pressure sensor 245 which is a pressure detector (pressure detecting part) configured to detect the inside pressure of the process chamber 201 an auto pressure controller (APC) valve 244 which is a pressure regulator (pressure regulating unit). The APC valve 244 is an on-off valve, which can be opened and closed to start and stop vacuum evacuation of the inside of the process chamber 201 and can be adjusted in degree of valve opening for pressure adjustment. By controlling the degree of opening of the APC valve 244 based on pressure information detected by the pressure sensor 245 while operating the vacuum pump 246, the inside of the process chamber 201 can be vacuum-evacuated to a predetermined pressure (vacuum degree). Mainly, the exhaust pipe 231, the APC valve 244, the vacuum pump 246, and the pressure sensor 245 constitute an exhaust system.

At the lower side of the reaction tube 203, a seal cap 219 is installed as a furnace port cover capable of hermetically closing the opened bottom side of the reaction tube 203. The seal cap 219 is configured to make contact with the bottom side of the reaction tube 203 in a perpendicular direction from the lower side. For example, the seal cap 219 is made of a metal such as stainless steel and has a disk shape. On the surface of the seal cap 219, an O-ring 220 is installed as a seal member configured to make contact with the bottom side of the reaction tube 203. At a side of the seal cap 219 opposite to the process chamber 201, a rotary mechanism 267 is installed to rotate a substrate holding tool such as the boat 217 (described later). A shaft 255 of the boat rotary mechanism 267 penetrates the seal cap 219 and is connected to the boat 217. By rotating the boat 217 with the rotary mechanism 267, wafers 200 can be rotated. The seal cap 219 is configured to be vertically moved by an elevating mechanism such as a boat elevator 115 vertically installed at the outside of the reaction tube 203. The boat elevator 115 is configured so that the boat 217 can be loaded into and unloaded from the process chamber 201 by raising and lowering the seal cap 219 with the boat elevator 115.

The boat 217, which is a substrate support tool, is made of a heat-resistant material such as quartz or silicon carbide and is configured to support a plurality of wafers 200 in a state where the wafers 200 are horizontally oriented and arranged in multiple stages with the centers of the wafers 200 being aligned with each other. At the lower part of the boat 217, an insulating member 218 made of a heat-resistant material such as quartz or silicon carbide is installed so as to prevent heat transfer from the heater 207 to the seal cap 219. The insulating member 218 may include a plurality of insulating plates made of a heat-resistant material such as quartz or silicon carbide, and an insulating plate holder configured to support the insulating plates in a state where the insulating plates are horizontally oriented and arranged in multiple stages.

Inside the reaction tube 203, a temperature sensor 263 is installed as a temperature detector, and by controlling power supplied to the heater 207 based on temperature information detected by the temperature sensor 263, desired temperature distribution can be attained at the inside of the process chamber 201. Like the first and second nozzles 233a and 233b, the temperature sensor 263 has an L-shape and is disposed along the inner wall of the reaction tube 203.

A controller 121, which is a control unit (control device), is connected to devices such as the mass flow controllers 241a, 241b, 241c, 241d, 241e, and 241f; valves 243a, 243b, 243c, 243d, 243e, and 243f; the pressure sensor 245; the APC valve 244; the vacuum pump 246; the heater 207; the temperature sensor 263; the boat rotary mechanism 267; the boat elevator 115; the high-frequency power source 273; and the matching device 272. The controller 121 controls, for example, flow rates of various gases by using the mass flow controllers 241a, 241b, 241c, 241d, 241e, and 241f; opening/closing operations of the valves 243a, 243b, 243c, 243d, 243e, and 243f; opening/closing operations of the APC valve 244 and pressure adjusting operations of the APC valve 244 based on the pressure sensor 245; the temperature of the heater 207 based on the temperature sensor 263; starting/stopping operations of the vacuum pump 246; the rotation speed of the boat rotary mechanism 267; ascending and descending operations of the boat 217 activated by the boat elevator 115; power supply to the high-frequency power source 273; and impedance adjusting operations using the matching device 272.

Next, an explanation will be given on an exemplary method of forming an insulating film such as an oxide film on a substrate and modifying changing the oxide film by using the process furnace 202 of the substrate processing apparatus in one process of processes of manufacturing a semiconductor device. In the following description, the controller 121 controls parts of the substrate processing apparatus.

Figure 3:
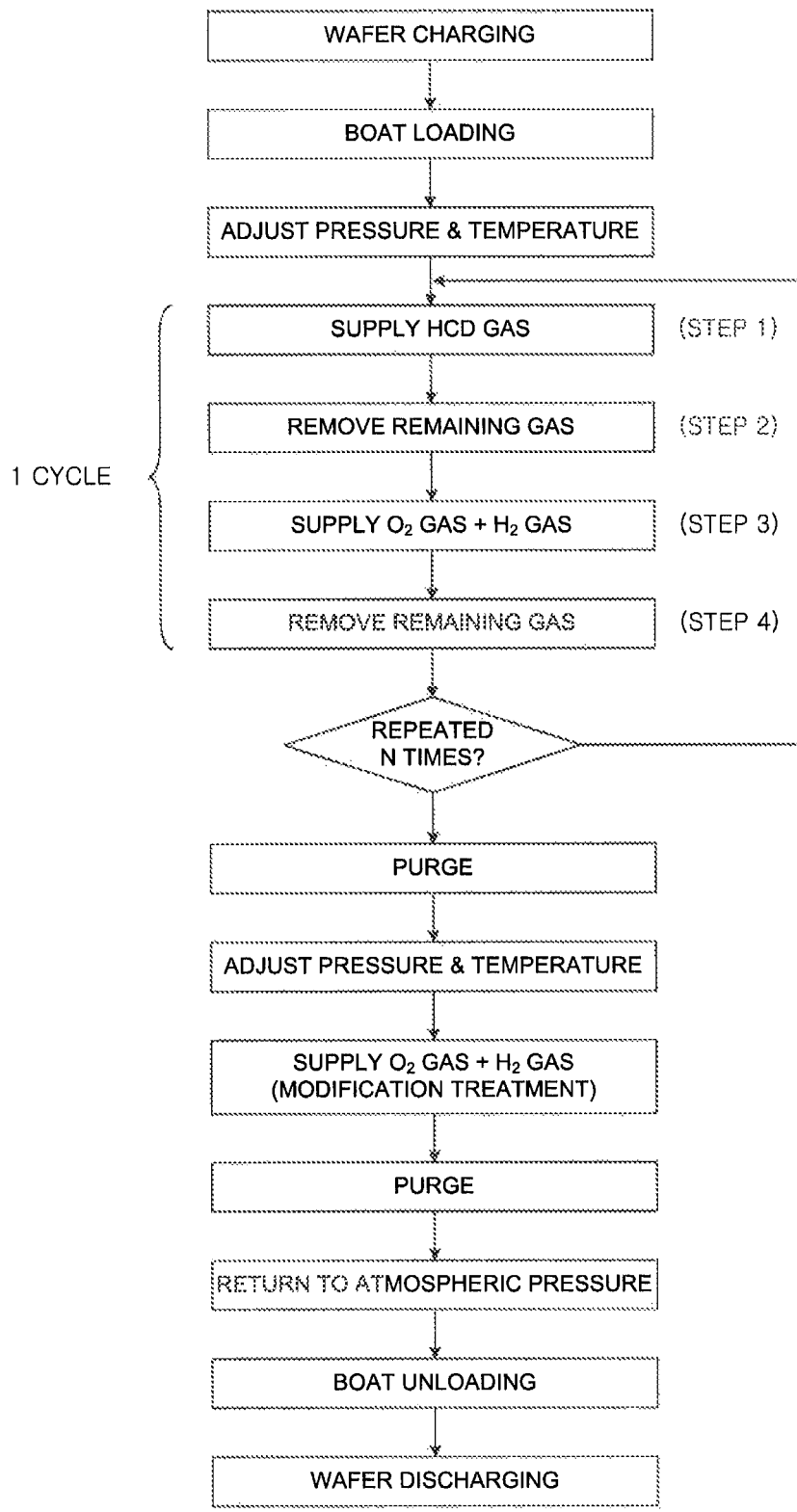
FIG. 3 is a flowchart for explaining process flows according to an embodiment of the present invention.
Figure 4:
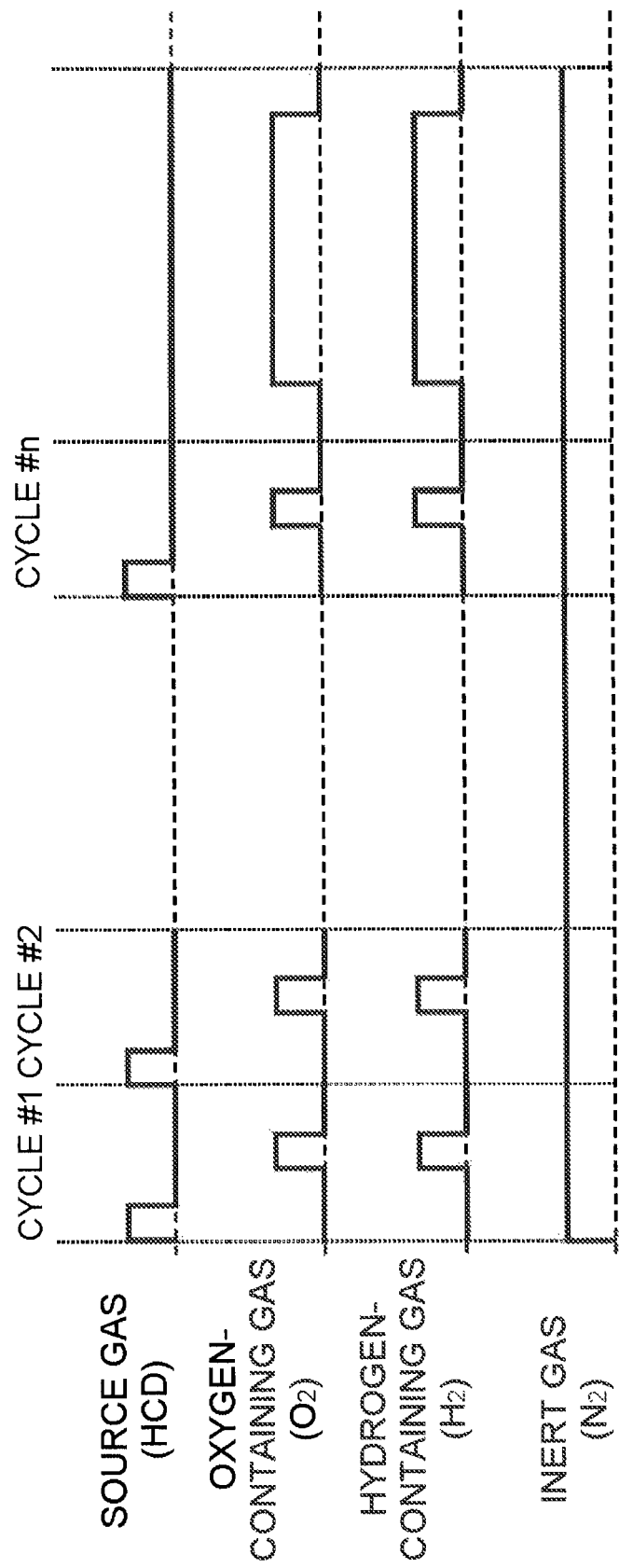
FIG. 4 is a view illustrating gas supply timings of a process sequence for an exemplary case of forming a silicon oxide film on a substrate according to the embodiment of the present invention.

FIG. 3 illustrates process flows according to an embodiment of the present invention, and FIG. 4 illustrates gas supply timings according to a process sequence of the embodiment of the present invention. According to the process sequence of the current embodiment, an oxide film is formed on a substrate by alternately repeating: a process of supplying a source gas into the process vessel in which substrates are accommodated and exhausting the source gas from the process vessel; and a process of supplying an oxygen-containing gas and a hydrogen-containing gas into the process vessel which is heated and kept at a pressure lower than atmospheric pressure and exhausting the oxygen-containing gas and the hydrogen-containing gas. Thereafter, the oxide film formed on the substrate is modified by supplying an oxygen-containing gas and a hydrogen-containing gas into the process vessel which is heated and kept at a pressure lower than atmospheric pressure and exhausting the oxygen-containing gas and the hydrogen-containing gas.

Hereinafter, a detailed explanation will be given. In the following description of the current embodiment, an explanation will be given on an example where silicon oxide films ($SiO_2$ films) are formed on substrates as oxide films according to the process flows shown in FIG. 3 and the process sequence shown in FIG. 4 by using HCD gas as a source gas, $O_2$ gas as an oxygen-containing gas, $H_2$ gas as a hydrogen-containing gas, and $N_2$ gas as a purge gas.

After a plurality of wafers 200 are charged into the boat 217 (wafer charging), as shown in FIG. 1, the boat 217 in which the plurality of wafers 200 are supported is lifted and loaded into the process chamber 201 by the boat elevator 115 (boat loading). In this state, the bottom side of the reaction tube 203 is sealed by the seal cap 219 with the O-ring 220 being disposed therebetween.

The inside of the process chamber 201 is vacuum-evacuated to a desired pressure (vacuum degree) by using the vacuum pump 246. At this time, the pressure inside the process chamber 201 is measured by the pressure sensor 245, and based on the measured pressure, the APC valve 244 is feedback-controlled (pressure adjustment). In addition, the inside of the process chamber 201 is heated to a desired temperature by using the heater 207. At this time, to obtain desired temperature distribution inside the process chamber 201, power to the heater 207 is feedback-controlled based on temperature information measured by the temperature sensor 263 (temperature adjustment). Next, the boat 217 is rotated by the rotary mechanism 267 to rotate the wafers 200. Thereafter, silicon oxide films are formed through a film-forming process by sequentially performing the following four steps.

<Film-Forming Process>

[Step 1]

The valve 243a of the first gas supply pipe 232a is opened to allow a flow of HCD gas through the first gas supply pipe 232a. The flow rate of the HCD gas flowing through the first gas supply pipe 232a is controlled by the mass flow controller 241a. The HCD gas adjusted in flow rate is supplied through the gas supply holes 248a of the first nozzle 233a into the process chamber 201 which is heated and depressurized, and the HCD gas is exhausted through the exhaust pipe 231 (HCD gas supply). At this time, the valve 243d of the first inert gas supply pipe 232d may be opened to supply inert gas such as $N_2$ gas through the first inert gas supply pipe 232d. The flow rate of the $N_2$ gas is adjusted by the mass flow controller 241d and is supplied into the first gas supply pipe 232a. At this time, a mixture of the HCD gas and the $N_2$ gas is supplied through the first nozzle 233a.

At this time, the APC valve 244 is properly controlled to keep the inside of the process chamber 201 at a pressure lower than atmospheric pressure, for example, in the range from 10 Pa to 1,000 Pa. The supply flow rate of the HCD gas controlled by the mass flow controller 241a is, for example, in the range from 20 sccm to 1,000 sccm (0.02 slm to 1 slm). The supply flow rate of the $N_2$ gas controlled by the mass flow controller 241d is, for example, in the range from 200 sccm to 1,000 sccm (0.2 slm to 1 slm). The wafers 200 are exposed to the HCD gas, for example, for 1 second to 120 seconds. The temperature of the heater 207 is set such that a CVD reaction can be caused in the process chamber 201 in the above-mentioned pressure range. That is, the temperature of the heater 207 is set such that the temperature of the wafers 200 can be kept in the range from 350° C. to 850° C., preferably, in the range from 400° C. to 700° C. If the temperature of the wafers 200 is lower than 350° C., decomposition and adsorption of HCD on the wafers 200 are difficult. In addition, if the temperature of the wafers 200 is lower than 400° C., the film-forming rate becomes lower than a practically acceptable level. On the other hand, if the temperature of the wafers 200 is higher than 700° C., particularly, higher than 850° C., CVD reaction becomes very active to reduce uniformity. Therefore, the wafers 200 may be kept in the temperature range from 350° C. to 850° C., preferably, in the range from 400° C. to 700° C.

By supplying HCD gas into the process chamber 201 under the above-described conditions, silicon layers can be formed on the wafers 200 (on the under-layer films of the wafers 200) as silicon-containing layers each constituted by less than one atomic layer to several atomic layers. The silicon-containing layers may be HCD adsorption layers. The silicon layer is a general term used to denote a layer made of silicon, such as a continuous silicon layer, a discontinuous silicon layer, and a thin film in which such layers are overlapped. In addition, a continuous layer made of silicon may also be called "a thin silicon film." In addition, a HCD adsorption layer is a term including a continuous chemical adsorption layer formed by chemical adsorption of molecules of HCD gas and a discontinuous chemical adsorption layer formed by chemical adsorption of molecules of HCD gas. Furthermore, the expression "a layer less than one atomic layer" is used to denote a discontinuous atomic layer. In a condition where HCD gas decomposes by itself, a silicon layer is formed on a substrate by deposition of silicon on the substrate. In a condition where HCD gas does not decompose by itself, an adsorption layer of the HCD gas is formed on a substrate by adsorption of the HCD gas on the substrate. If the thickness of a silicon-containing layer formed on the wafer 200 is greater than the thickness of several atomic layers, the silicon-containing layer may not be entirely oxidized in step 3 (described later). In addition, the minimum of a silicon-containing layer that can be formed on the wafer 200 is less than one atomic layer. Therefore, it may be preferable that the thickness of the silicon-containing layer is set to be in the range from about the thickness of less than one atomic layer to about the thickness of several atomic layers. The case where a silicon layer is formed on a substrate is more preferable than the case where a HCD gas adsorption layer is formed on a substrate because the film-forming rate of the former case is higher than that of the latter case.

Instead of using HCD as a silicon-containing source, another source may alternatively be used. Examples of such alternative sources include: an inorganic source such as TCS (tetrachlorosilane, $SiCl_4$), DCS (dichlorosilane, $SiH_2Cl_2$), and $SiH_4$ (monosilane); and an organic source such as aminosilane-based 4DMAS (tetrakisdimethylaminosilane, $Si[N(CH_3)_2]_4$), 3DMAS (trisdimethylaminosilane, $(Si[N(CH_3)_2]_3H)$, 2DEAS (bisdiethylaminosilane $(Si[N(C_2H_5)_2]_2H_2)$, and BTBAS (bistertiarybutylaminosilane $(SiH_2[NH(C_4H_9)]_2)$.

Instead of using $N_2$ gas as inert gas, a rare gas such as Ar gas, He gas, Ne gas, and Xe gas may be used as the inert gas. If a rare gas such as Ar or He gas that does not contain nitrogen (N) is used as the inert gas, a silicon oxide film having a low nitrogen (N) concentration (impurity concentration) can be formed. Therefore, it may be preferable that a rare gas such as Ar gas and He gas is used as the inert gas. This is the same in steps 2 and 3 (described later).

[Step 2]

After the silicon-containing layers are formed on the wafers 200, the valve 243a of the first gas supply pipe 232a is closed to interrupt the supply of HCD gas. At this time, the APC valve 244 of the exhaust pipe 231 is kept open, and the inside of the process chamber 201 is vacuum-evacuated by using the vacuum pump 246 so as to remove HCD gas remaining in the process chamber 201. At this time, if the valve 243d is opened to supply inert gas such as $N_2$ gas into the process chamber 201, the $N_2$ gas functions as a purge gas so that HCD gas remaining in the process chamber 201 without participating in an reaction or after participating in the formation of the silicon-containing layers can be removed more efficiently (remaining gas removal).

At this time, the temperature of the heater 207 is set such that the temperature of the wafers 200 can be in the range from 350° C. to 850° C., preferably, in the range from 400° C. to 700° C. like in the time when HCD gas is supplied. The supply flow rate of $N_2$ gas functioning as a purge gas is set to be in the range from 200 sccm to 1,000 sccm (0.2 slm to 1 slm). Instead of using $N_2$ gas as a purge gas, a rare gas such as Ar gas, He gas, Ne gas, and Xe gas may be used.

[Step 3]

After removing gas remaining in the process chamber 201, the valve 243b of the second gas supply pipe 232b is opened to allow a flow of $O_2$ gas through the second gas supply pipe 232b. The flow rate of the $O_2$ gas flowing through the second gas supply pipe 232b is controlled by the mass flow controller 241b. The $O_2$ gas adjusted in flow rate is supplied through the gas supply holes 248b of the second nozzle 233b into the buffer chamber 237 which is heated and depressurized. At the time, the valve 243c of the third gas supply pipe 232c is also opened so that $H_2$ gas can flow through the third gas supply pipe 232c. The flow rate of the $H_2$ gas flowing through the third gas supply pipe 232c is controlled by the mass flow controller 241c. The $H_2$ gas adjusted in flow rate is supplied to the second gas supply pipe 232b where the $H_2$ gas is supplied through the gas supply holes 248b of the second nozzle 233b into the buffer chamber 237 which is heated and depressurized. When the $H_2$ flows through the second gas supply pipe 232b, the $H_2$ gas is mixed with the $O_2$ gas in the second gas supply pipe 232b. That is, a mixture gas of the $O_2$ gas and the $H_2$ gas is supplied through the second nozzle 233b. The mixture gas of the $O_2$ gas and the $H_2$ gas supplied into the buffer chamber 237 is supplied through the gas supply holes 248c of the buffer chamber 237 into the process chamber 201 which is heated and depressurized, and the mixture gas is exhausted through the exhaust pipe 231 ($O_2$ gas+$H_2$ gas supply).

At this time, the valve 243e of the second inert gas supply pipe 232e may be opened to supply inert gas such as $N_2$ gas through the second inert gas supply pipe 232e. The flow rate of the $N_2$ gas is adjusted by the mass flow controller 241e and is supplied into the second gas supply pipe 232b. In addition, the valve 243f of the third inert gas supply pipe 232f may be opened to supply inert gas such as $N_2$ gas through the third inert gas supply pipe 232f. The flow rate of the $N_2$ gas is adjusted by the mass flow controller 241f and is supplied into the third gas supply pipe 232c. At this time, a mixture gas of the $O_2$ gas, and $H_2$ gas, and $N_2$ gas is supplied through the second nozzle 233b. Instead of using $N_2$ gas as inert gas, a rare gas such as Ar gas, He gas, Ne gas, and Xe gas may be used as inert gas.

At this time, the APC valve 244 is properly controlled to keep the inside of the process chamber 201 at a pressure lower than atmospheric pressure, for example, at a pressure ranging from 1 Pa to 1,330 Pa. The flow rate of the $O_2$ gas controlled by the mass flow controller 241b is, for example, in the range from 100 sccm to 10,000 sccm (0.1 slm to 10 slm). The flow rate of the $H_2$ gas controlled by the mass flow controller 241c is, for example, in the range from 100 sccm to 10,000 sccm (0.1 slm to 10 slm). In addition, the supply flow rates of the $N_2$ gas controlled by the mass flow controllers 241e and 241f are, for example, in the range from 0 sccm to 2,000 sccm (0 slm to 2 slm), respectively. In addition, the concentration of the $H_2$ gas ($H_2/(H_2+O_2)$) is, for example, in the range from 25% to 50%, preferable, in the range from 10% to 33%. That is, for example, it is set such that the proportion of $O_2$ gas is equal to or greater than the proportion of $H_2$ gas. Preferably, the proportion of $O_2$ gas is set to be greater than the proportion of $H_2$ gas. That is, an oxygen-rich condition is made. The wafers 200 are exposed to the $O_2$ gas and $H_2$ gas, for example, for 1 second to 120 seconds. The temperature of the heater 207 is set such that the temperature of the wafers 200 can be kept, for example, in the range from 350° C. to 1,200° C. It was ascertained that oxidizing power could be improved by adding $H_2$ gas to $O_2$ gas under a depressurized atmosphere in the above-described temperature range. In addition, it was also ascertained that oxidizing power could not be improved if the temperature of the wafers 200 was too low. However, if the throughput is considered, as long as oxidizing power can be improved, it may be preferable that the wafers 200 are kept at the same temperature as in step 1 where HCD gas is supplied. That is, it may be preferable that the temperature of the heater 207 is set to keep the inside of the process chamber 201 in the same temperature in step 1 and step 3. In this case, the temperature of the heater 207 is set such that the temperature of the wafers 200, that is, the inside temperature of the process chamber 201 can be kept at a constant temperature in the range from 350° C. to 850° C., preferably, in the range from 400° C. to 700° C. in step 1 and step 3. In addition, it may be preferable that the temperature of the heater 207 is set such that the inside temperature of the process chamber 201 can be kept at the same temperature in step 1 through step 4 (described later). In this case, the temperature of the heater 207 is set such that the inside temperature of the process chamber 201 can be kept at a constant temperature in the range from 350° C. to 850° C., preferably, in the range from 400° C. to 700° C. in step 1 through step 4 (described later). In addition, to improve oxidizing power by adding $H_2$ gas to $O_2$ gas under a depressurized atmosphere, it is necessary to keep the inside temperature of the process chamber 201 at 350° C. or higher, preferably 400° C. or higher, more preferably, 450° C. or higher. If the inside temperature of the process chamber 201 is kept at 400° C. or higher, it is possible to obtain oxidizing power greater than that in an $O_3$ oxidizing treatment performed at 400° C. or higher. If the inside temperature of the process chamber 201 is kept at 450° C. or higher, it is possible to obtain oxidizing power greater than that in an $O_2$ plasma oxidizing treatment performed at 450° C. or higher.

By supplying $O_2$ gas and $H_2$ gas into the process chamber 201 under the above-described conditions, the $O_2$ gas and $H_2$ gas can be thermally activated without using plasma under a heated and depressurized atmosphere to react with each other, so that an oxidizing species including oxygen (O) such as atomic oxygen can be produced. Then, the silicon-containing layers formed on the wafers 200 in step 1 are oxidized mainly by the oxidizing species. By the oxidation, the silicon-containing layers are changed into silicon oxide layers ($SiO_2$ layers, hereinafter referred to as SiO layers simply). By this oxidizing treatment, as described above, oxidizing power can be largely increased as compared with the case where only $O_2$ gas is supplied. That is, by adding $H_2$ to $O_2$ gas under a depressurized atmosphere, oxidizing power can be largely increased as compared with the case where only $O_2$ gas is supplied.

Alternatively, at this time, one or both of $O_2$ gas and $H_2$ gas may be activated by plasma. An oxidizing species having more energy can be produced by supplying $O_2$ gas and $H_2$ gas after activating the $O_2$ gas and/or $H_2$ gas by plasma, and effects such as improvement in device characteristics can be obtained by performing an oxidizing treatment using the oxidizing species. For example, when both of O₂ gas and H₂ gas are activated by plasma, high-frequency power is applied across the first rod-shaped electrodes 269 and 270 from the high-frequency power source 273 through the matching device 272, and then the mixture gas of the O₂ gas and H₂ gas supplied into the buffer chamber 237 is plasma-excited as an activated species and is supplied into the process chamber 201 through the gas supply holes 248c while being exhausted through the exhaust pipe 231. At this time, the high-frequency power applied across the first rod-shaped electrode 269 and the second rod-shaped electrode 270 from the high-frequency power source 273 is set to be in the range of, for example, 50 W to 1,000 W. Other process conditions are set to be the same as those explained in the above description. Furthermore, in the above-described temperature range, O₂ gas and H₂ gas can be thermally activated for sufficient reaction necessary to produce a sufficient amount of oxidizing species. That is, although O₂ gas and H₂ gas are thermally activated without using plasma, sufficient oxidizing power can be obtained. In the case where O₂ gas and H₂ gas are thermally activated and are supplied, soft reaction can be caused, and thus the above-described oxidizing treatment can be softly performed.

As well as oxygen (O₂) gas, another gas such as ozone (O₃) gas may be used as an oxygen-containing gas (oxidizing gas). According to an experiment in which hydrogen-containing gas was added to nitric oxide (NO) gas or nitrous oxide (N₂O) gas in the above-described temperature range, oxidizing power was not improved as compared with the case where only NO gas or N₂O gas was supplied. That is, it is preferable that gas containing oxygen but not nitrogen (that is, gas not containing nitrogen but containing oxygen) is used as an oxygen-containing gas. As hydrogen-containing gas, not only hydrogen (H₂) gas but also another gas such as deuterium (D₂) gas may be used. In addition, if gas such as ammonia (NH₃) gas or methane (CH₄) gas is used, nitrogen (N) or carbon (C) may permeate into films as an impurity. That is, it is preferable that gas containing hydrogen but not other elements (that is, gas not containing other elements than hydrogen or deuterium) is used as a hydrogen-containing gas. That is, at least one selected from the group consisting of O₂ gas and O₃ gas may be used as an oxygen-containing gas, and at least one selected from the group consisting of H₂ gas and D₂ gas may be used as a hydrogen-containing gas.

[Step 4]

After the silicon-containing layers are changed into silicon oxide layers, the valve 243b of the second gas supply pipe 232b is closed to interrupt the supply of O₂ gas. In addition, the valve 243c of the third gas supply pipe 232c is closed to interrupt the supply of H₂ gas. At this time, the APC valve 244 of the exhaust pipe 231 is kept open, and the inside of the process chamber 201 is vacuum-evacuated by using the vacuum pump 246 so as to remove O₂ gas and H₂ gas remaining in the process chamber 201. At this time, if the valves 243e and 243f are opened to supply inert gas such as N₂ gas into the process chamber 201, the N₂ gas functions as a purge gas so that O₂ gas or H₂ gas remaining in the process chamber 201 without participating in an reaction or after participating in the formation of the silicon oxide layers can be removed more efficiently (remaining gas removal).

At this time, the temperature of the heater 207 is set such that the temperature of the wafers 200 can be in the range from 350° C. to 850° C., preferably, in the range from 400° C. to 700° C. like in the time when O₂ gas and H₂ gas are supplied. The supply flow rate of N₂ gas functioning as a purge gas is set to be in the range from 200 sccm to 1,000 sccm (0.2 slm to 1 slm). Instead of using N2 gas as a purge gas, rare gas such as Ar gas, He gas, Ne gas, and Xe gas may be used as a purge gas.

The above-described step 1 to step 4 are set as one cycle, and the cycle is performed at least once, preferably, a plurality of times, so as to form silicon oxide films (SiO₂ films) on the wafers 200 to a predetermined thickness.

After the silicon oxide films are formed to a predetermined thickness, the valves 243d, 243e, and 243f are opened to supply inert gas such as N₂ gas into the process chamber 201 through the first inert gas supply pipe 232d, the second inert gas supply pipe 232e, and the third inert gas supply pipe 232f while exhausting the N₂ gas through the exhaust pipe 231. The N₂ gas functions as a purge gas. Thus, the inside of the process chamber 201 can be purged with inert gas, and gas remaining in the process chamber 201 can be removed (purge).

Thereafter, the inside of the process chamber 201 is vacuum-evacuated to a desired pressure (vacuum degree) by using the vacuum pump 246. At this time, the pressure inside the process chamber 201 is measured by the pressure sensor 245, and based on the measured pressure, the APC valve 244 is feedback-controlled (pressure adjustment). In addition, the inside of the process chamber 201 is heated to a desired temperature by using the heater 207. At this time, to obtain desired temperature distribution inside the process chamber 201, power to the heater 207 is feedback-controlled based on temperature information measured by the temperature sensor 263 (temperature adjustment). In addition, at this time, the heater 207 is controlled in a manner such that the wafers 200 can be kept at a temperature equal to or higher than the temperature of the wafers 200 during the film-forming process. The boat 217 (that is, the wafers 200) is continuously rotated by the rotary mechanism 267 during the film-forming process. Thereafter, a modification process is performed to modify the silicon oxide films having a predetermined thickness formed on the wafers 200.

<Modification Process>

In the modification process, the valve 243b of the second gas supply pipe 232b is opened to allow a flow of O₂ gas through the second gas supply pipe 232b. The flow rate of the O₂ gas flowing through the second gas supply pipe 232b is controlled by the mass flow controller 241b. The O₂ gas adjusted in flow rate is supplied through the gas supply holes 248b of the second nozzle 233b into the buffer chamber 237 which is heated and depressurized. At the time, the valve 243c of the third gas supply pipe 232c is also opened so that H₂ gas can flow through the third gas supply pipe 232c. The flow rate of the H₂ gas flowing through the third gas supply pipe 232c is controlled by the mass flow controller 241c. The H₂ gas adjusted in flow rate is supplied to the second gas supply pipe 232b where the H₂ gas is supplied through the gas supply holes 248b of the second nozzle 233b into the buffer chamber 237 which is heated and depressurized. When the H₂ flows through the second gas supply pipe 232b, the H₂ gas is mixed with the O₂ gas in the second gas supply pipe 232b. That is, a mixture gas of the O₂ gas and the H₂ gas is supplied through the second nozzle 233b. The mixture gas of the O₂ gas and the H₂ gas supplied into the buffer chamber 237 is supplied through the gas supply holes 248c of the buffer chamber 237 into the process chamber 201 which is heated and depressurized, and the mixture gas is exhausted through the exhaust pipe 231 (O₂ gas+H₂ gas supply (modification process)).

At this time, the valve 243e of the second inert gas supply pipe 232e may be opened to supply an inert gas such as N₂ gas through the second inert gas supply pipe 232e. The flow rate of the N2 gas is adjusted by the mass flow controller 241e and is supplied into the second gas supply pipe 232b. In addition, the valve 243f of the third inert gas supply pipe 232f may be opened to supply inert gas such as $N_2$ gas through the third inert gas supply pipe 232f. The flow rate of the N2 gas is adjusted by the mass flow controller 241f and is supplied into the third gas supply pipe 232c. At this time, a mixture gas of the $O_2$ gas, $H_2$ gas, and $N_2$ gas is supplied through the second nozzle 233b. Instead of using $N_2$ gas as inert gas, a rare gas such as Ar gas, He gas, Ne gas, and Xe gas may be used as inert gas.

At this time, the APC valve 244 is properly controlled to keep the inside of the process chamber 201 at a pressure lower than atmospheric pressure, for example, at a pressure ranging from 1 Pa to 1,330 Pa. The flow rate of the $O_2$ gas controlled by the mass flow controller 241b is, for example, in the range from 100 sccm to 10,000 sccm (0.1 slm to 10 slm). The flow rate of the $H_2$ gas controlled by the mass flow controller 241c is, for example, in the range from 100 sccm to 10,000 sccm (0.1 slm to 10 slm). In addition, the supply flow rates of the N2 gas controlled by the mass flow controllers 241e and 241f are, for example, in the range from 0 sccm to 2,000 sccm (0 slm to 2 slm), respectively. In addition, the concentration of the $H_2$ gas ($H_2/(H_2+O_2)$) is, for example, in the range from 25% to 50%, preferable, in the range from 10% to 33%. That is, for example, it is set such that the proportion of $O_2$ gas is equal to or greater than the proportion of $H_2$ gas. Preferably, the proportion of $O_2$ gas is set to be greater than the proportion of $H_2$ gas. That is, an oxygen-rich condition is made. The wafers 200 are exposed to the $O_2$ gas and $H_2$ gas, for example, for 1 minute to 600 minutes. The temperature of the heater 207 is set such that the temperature of the wafers 200 can be kept, for example, in the range from 350° C. to 1,200° C. It was ascertained that impurities could be removed from films more effectively by adding $H_2$ gas to $O_2$ gas under a depressurized atmosphere in the above-mentioned temperature range as compared with the case where only $O_2$ gas was supplied ($O_2$ annealing). In addition, it was ascertained that impurities could be removed from films more effectively as compared with the case where only $N_2$ gas was supplied at atmospheric pressure ($N_2$ annealing). For the throughput, it is preferable that the temperature of the heater 207 is set such that the temperature of the wafers 200 can be kept in the same temperature range in the film-forming process and the modification process. That is, it is preferable that the inside of the process chamber 201 is kept in the same temperature range in the film-forming process and the modification process. In this case, the temperature of the heater 207 is set such that the temperature of the wafers 200, that is, the inside temperature of the process chamber 201 can be kept at a constant temperature in the range from 350° C. to 850° C., preferably, in the range from 400° C. to 700° C. in the film-forming process and modification process. However, since impurities can be removed from the films more effectively by keeping the wafers 200 at a high temperature in the modification process, it may be more preferable that the wafers 200 are kept at a higher temperature in the modification process than in the film-forming process.

By supplying $O_2$ gas and $H_2$ gas into the process chamber 201 under the above-described conditions, the $O_2$ gas and $H_2$ gas can be thermally activated without using plasma under a heated and depressurized atmosphere to react with each other, so that an oxidizing species including oxygen (O) such as atomic oxygen can be produced. Then, the silicon oxide films formed on the wafers 200 in the film-forming process are oxidized mainly by the oxidizing species. Then, by this modification process, impurities included in the silicon oxide films are removed. As described above, the modification process is more effective to remove impurities from the films as compared with $O_2$ annealing or $N_2$ annealing. That is, impurities can be removed from the films more effectively by adding $H_2$ gas to $O_2$ gas under a depressurized atmosphere as compared with $O_2$ annealing or $N_2$ annealing.

Alternatively, at this time, one or both of $O_2$ gas and $H_2$ gas may be activated by plasma. An oxidizing species having more energy can be produced by supplying $O_2$ gas and $H_2$ gas after activating the $O_2$ gas and/or $H_2$ gas by plasma, and effects such as improvement in device characteristics can be obtained by performing the modification process using the oxidizing species. For example, when both of $O_2$ gas and $H_2$ gas are activated by plasma, high-frequency power is applied across the first rod-shaped electrodes 269 and 270 from the high-frequency power source 273 through the matching device 272, and then the mixture gas of the $O_2$ gas and $H_2$ gas supplied into the buffer chamber 237 is plasma-excited as an activated species and is supplied into the process chamber 201 through the gas supply holes 248c while being exhausted through the exhaust pipe 231. At this time, the high-frequency power applied across the first rod-shaped electrode 269 and the second rod-shaped electrode 270 from the high-frequency power source 273 is set to be in the range of, for example, 50 W to 1,000 W. Other process conditions are set to be the same as those explained in the above description. Furthermore, in the above-described temperature range, $O_2$ gas and $H_2$ gas can be thermally activated for sufficient reaction necessary to produce a sufficient amount of oxidizing species. That is, although $O_2$ gas and $H_2$ gas are thermally activated without using plasma, sufficient oxidizing power can be obtained. In the case where O2 gas and H2 gas are thermally activated and are supplied, soft reaction can be caused, and thus the above-described modification process can be softly performed.

As well as oxygen ($O_2$) gas, another gas such as ozone ($O_3$) gas may be used as an oxygen-containing gas (oxidizing gas). According to an experiment in which hydrogen-containing gas was added to nitric oxide (NO) gas or nitrous oxide ($N_2O$) gas in the above-described temperature range, oxidizing power was not improved as compared with the case where only NO gas or $N_2O$ gas was supplied. That is, sufficient impurity removing effect could not be obtained. That is, it is preferable that gas containing oxygen but not nitrogen (that is, gas not containing nitrogen but containing oxygen) is used as oxygen-containing gas. As hydrogen-containing gas, not only hydrogen ($H_2$) gas but also another gas such as deuterium ($D_2$) gas may be used. In addition, if gas such as ammonia ($NH_3$) gas or methane ($CH_4$) gas is used, nitrogen (N) or carbon (C) may permeate into films as an impurity. That is, it is preferable that gas containing hydrogen but not other elements (that is, gas not containing other elements than hydrogen or deuterium) is used as a hydrogen-containing gas. That is, at least one selected from the group consisting of $O_2$ gas and $O_3$ gas may be used as an oxygen-containing gas, and at least one selected from the group consisting of $H_2$ gas and $D_2$ gas may be used as a hydrogen-containing gas.

After the modification process is completed, the valves 243d, 243e, and 243f are opened to supply inert gas such as $N_2$ gas into the process chamber 201 through the first inert gas supply pipe 232d, the second inert gas supply pipe 232e, and the third inert gas supply pipe 232f while exhausting the $N_2$ gas through the exhaust pipe 231. The N2 gas functions as a purge gas. Thus, the inside of the process chamber 201 can be purged with inert gas, and gas remaining in the process chamber 201 can be removed (purge). Then, the inside atmosphere of the process chamber 201 is replaced with inert gas, and the inside of the process chamber 201 returns to atmospheric pressure (return to atmospheric pressure).

Thereafter, the boat elevator 115 lowers the seal cap 219 to open the bottom side of the reaction tube 203 and unload the boat 217 in which the processed wafers 200 are held to the outside of the reaction tube 203 through the bottom side of the reaction tube 203 (boat unloading). Then, the processed wafers 200 are discharged from the boat 217 (wafer discharging).

In the modification process of the current embodiment, $O_2$ gas and $H_2$ gas are allowed to react with each other under a heated and depressurized atmosphere to produce an oxidizing species containing oxygen (O) such as atomic oxygen, and the silicon oxide films ($SiO_2$ films) are modified by using the oxidizing species. Since the energy of the oxidizing species is greater than the bond energy of Si—N, Si—Cl, Si—H, and Si—C bonds of the silicon oxide films, the Si—N, Si—Cl, Si—H, and Si—C bonds of the silicon oxide films can be broken by giving the energy of the oxidizing species to the silicon oxide films (objects of oxidizing treatment). N, H, Cl, and C separated from Si are removed from the films are discharged in the form of $N_2$, $H_2$, $Cl_2$, HCl, $CO_2$, etc. In addition, Si bonding electrons remaining after N, H, Cl, and C are separated is coupled with O included in the oxidizing species, thereby forming Si—O bonds. In addition, at this time, the silicon oxide films are densified. In this way, the silicon oxide films are modified. It was ascertained that the $SiO_2$ films formed by the process sequence of the current embodiment had very low nitrogen, hydrogen, chlorine, and carbon concentrations and the ratio of Si/O of the $SiO_2$ film was very close to a stoichiometric composition ratio, 0.5. That is, high-quality films could be formed.

In step 3 of the film-forming process of the current embodiment, $O_2$ gas and $H_2$ gas are allowed to react with each other under a heated and depressurized atmosphere to produce an oxidizing species containing oxygen (O) such as atomic oxygen. By using the oxidizing species, the silicon-containing layers (Si layers or HCD gas adsorption layers) are changed into silicon oxide layers (SiO layers). Since the energy of the oxidizing species is greater than the bond energy of Si—N, Si—Cl, Si—H, and Si—C bonds of the silicon-containing layers, the Si—N, Si—Cl, Si—H, and Si—C bonds of the silicon-containing layers can be broken by giving the energy of the oxidizing species to the silicon-containing layers (objects of oxidizing treatment). N, H, Cl, and C separated from Si are removed from the layers are discharged in the form of $N_2$, $H_2$, $Cl_2$, HCl, $CO_2$, etc. In addition, Si bonding electrons remaining after N, H, Cl, and C are separated is coupled with O included in the oxidizing species, thereby forming Si—O bonds. In this way, the silicon-containing layers are changed into silicon oxide layers by oxidation. That is, according to the current embodiment, the same impurity removing effect as that of the modification process can be obtained in the oxidizing treatment (step 3) of the film-forming process. Thus, according to the current embodiment, silicon oxide films having low nitrogen, hydrogen, chlorine, and carbon concentrations can be obtained. Then, by performing the modification process of the current embodiment to the silicon oxide films formed as described above, the nitrogen, hydrogen, chlorine, and carbon concentrations of the silicon oxide films can be further reduced, and thus high-quality oxide films having very low impurity concentrations can be obtained.

In this way, according to the current embodiment, silicon oxide films having low impurity concentrations are formed in the film-forming process, and modification treatment is performed to the silicon oxide films having low impurity concentrations in the modification process so as to further lower the impurity concentrations of the silicon oxide films. That is, according to the current embodiment, the impurity concentrations of the films are reduced in two steps: the impurity removing action in the oxidizing treatment (step 3) of the film-forming process, and the impurity removing action in the modification process.

In the current embodiment, process conditions of the oxidizing treatment (step 3) of the film-forming process may be set such that silicon-containing layers each constituted by less than one atomic layer to several atomic layers can be oxidized. Under these process conditions, the above-described impurity removing action can occur. Furthermore, in the current embodiment, process conditions of the modification process may be set such that modification treatment can be performed to silicon oxide films. That is, process conditions of the modification process may be set such that impurities can be removed from silicon oxide films more efficiently. In addition, it is known that the impurity removing action of the modification process occurs more vigorously as the temperature of substrates is increased and the supply times of gases are increased. Therefore, it is preferable that the temperature of substrates in the modification process is set to be higher than the temperature of the substrates in the oxidizing treatment (step 3) of the film-forming process or the supply times of gases in the modification process are set to be longer than the supply times of gases in the oxidizing treatment (step 3) of the film-forming process.

In addition, since it is known that the action of removing impurities from films is affected more strongly by the temperature of substrates than the supply times of gases in the modification process, setting the temperature of substrates to a high value is more preferable than setting the supply times of gases to long periods in the modification process to improve the efficiency of impurity removing action in the modification process.

In addition, it was ascertained that if a silicon oxide film was formed according to the process sequence of the current embodiment, the film thickness uniformity in a surface of a wafer could be improved as compared with the case where a silicon oxide film was formed according to a general CVD method. In a general CVD method, inorganic sources such as DCS and $N_2O$ are simultaneously supplied to form a silicon oxide film (HTO (higher temperature oxide) film) by chemical vapor deposition (CVD). In addition, it was ascertained that the impurity concentrations such as hydrogen and chlorine concentrations of a silicon oxide film formed by the process sequence of the current embodiment were much lower than those of a silicon oxide film formed by a general CVD method. In addition, it was ascertained that the impurity concentrations of a silicon oxide film formed by the process sequence of the current embodiment were much lower than those of a silicon oxide film formed by a CVD method using an organic silicon source. In addition, according to the process sequence of the current embodiment, although an organic silicon source was used, the film thickness uniformity in a surface of a wafer and the impurity concentrations of a film were satisfactory.

In the current embodiment, $O_2$ gas and $H_2$ gas are supplied from the same second nozzle 233b into the process chamber 201 through the buffer chamber 237, and the second nozzle 233b and the buffer chamber 237 are heated to the same temperature as the process chamber 201. Therefore, the $O_2$ gas and $H_2$ gas react with each other in the second nozzle 233b and the buffer chamber 237 which are heated and kept at a pressure lower than atmospheric pressure, and thus an oxidizing species containing oxygen is generated in the second nozzle 233b and the buffer chamber 237. In addition, the insides of the second nozzle 233b and the buffer chamber 237 are kept at a pressure higher than the inside pressure of the process chamber 201. This facilitates the reaction between the $O_2$ gas and $H_2$ gas in the second nozzle 233b and the buffer chamber 237, and thus a more amount of oxidizing species can be generated by the reaction between the $O_2$ gas and $H_2$ gas. As a result, oxidizing power can be increased, and impurities can be removed from films more effectively. In addition, since the $O_2$ gas and $H_2$ gas can be mixed with each other more uniformly in the second nozzle 233b and the buffer chamber 237 before being supplied into the process chamber 201, the $O_2$ gas and $H_2$ gas can react with each other more uniformly to produce an oxidizing species having a uniform concentration. As a result, oxidizing power can be uniformly applied among the wafers 200, and impurity removing effect can be uniform among the wafers 200. As described above, since $O_2$ gas and $H_2$ gas are supplied into the process chamber 201 through the same nozzle, oxidizing power can be increased much more, and the uniformity of the oxidizing power can be improved much more. In addition, impurity removing effect can be improved much more, and the uniformity of impurity removing effect can be improved much more. If plasma is used, the buffer chamber 237 may not be provided. However, the same effects as those described above can be obtained because $O_2$ gas and $H_2$ gas are mixed in the same nozzle 233b and supplied into the process chamber 201 from the same nozzle 233b.

In the case where $O_2$ gas and $H_2$ gas are supplied from the same second nozzle 233b into the process chamber 201 through the buffer chamber 237, although a more amount of oxidizing species can be produced in the second nozzle 233b and the buffer chamber 237, the oxidizing species may be deactivated while passing through the second nozzle 233b and the buffer chamber 237, and thus the amount of oxidizing species reaching the wafers 200 may be decreased. However, if $O_2$ gas and $H_2$ gas are supplied into the process chamber 201 from different nozzles, the $O_2$ gas and $H_2$ gas start to mix with each other in the process chamber 201, and thus an oxidizing species is generated in the process chamber 201 so that it may be possible to prevent the oxidizing species from being deactivated in the second nozzle 233b or the buffer chamber 237.

In the film-forming process of the current embodiment, $H_2$ gas which is a hydrogen-containing is intermittently supplied as shown in FIG. 4. That is, explanation has been given on an exemplary case where $H_2$ is supplied only in step 3. However, $H_2$ gas may be continuously supplied. That is, $H_2$ gas may be continuously supplied while step 1 to step 4 are repeated. Alternatively, $H_2$ gas may be intermittently supplied in step 1 and step 3 or in step 1 to step 3. Alternatively, $H_2$ gas may be supplied in step 2 and step 3 or in step 3 and step 4.

According to the current embodiment, in step 1 of the film-forming process, that is, when HCD gas is supplied, $H_2$ gas may be supplied to extract Cl from the HCD gas and thus to increase the film-forming rate and reduce the Cl impurity concentration of films. Furthermore, in step 2, that is, after the supply of HCD gas is stopped, $H_2$ gas may be supplied before $O_2$ gas is supplied, for effectively controlling film thickness uniformity. Furthermore, in step 2, by supplying $H_2$ gas prior to supply of $O_2$ gas, for example, an oxide film may be formed on parts where metal and silicon are exposed in a manner such that the oxide film is uniformly laid on the metal and silicon without oxidizing the metal. Furthermore, in step 4, that is, after supply of $O_2$ is stopped but supply of HCD gas is not started, $H_2$ gas may be supplied to terminate the surfaces of SiO layers formed in step 3 with hydrogen so that HCD gas supplied in the next step 1 can be easily adsorbed on the surfaces of the SiO layers.

Furthermore, in the film-forming process of the above-described embodiment, step 1, step 2, step 3, and step 4 are sequentially performed. Step 1, step 2, step 3, and step 4 are set as one cycle, and the cycle is performed at least once, preferably, a plurality of times, to form silicon oxide films having a predetermined thickness on the wafers 200. Unlike this, the order of step 1 and step 3 may be changed. That is, step 3, step 2, step 1, and step 4 may be sequentially performed. Step 3, step 2, step 1, and step 4 may be set as one cycle, and the cycle may be performed at least once, preferably, a plurality of times, so as to form silicon oxide films on the wafers 200 to a predetermined thickness.

Furthermore, according to the above-described embodiment, in step 3 of the film-forming process, silicon-containing layers are changed into silicon oxide layers by using $O_2$ gas and $H_2$ gas as an oxidant. However, an oxygen-containing gas such as $O_2$ gas, $O_3$ gas, or $H_2O$ gas may be used alone as an oxidant, or an oxygen-containing gas activated by plasma may be used as an oxidant. For example, a gas obtained by activating $O_2$ gas by plasma may be used. The same effects as those described above can be obtained by modifying oxide films formed in this way through the modification process of the above-described embodiment.

Furthermore, in the above-described embodiment, silicon oxide films ($SiO_2$ films) containing semiconductor silicon (Si) are formed on substrates as oxide films. However, the present invention may be applied to other cases where metal oxide films containing a metal element such as zirconium (Zr), hafnium (Hf), titanium (Ti), or aluminium (Al) are formed on substrates as oxide films. In this case, formation of layers containing a metal element on substrates by supplying a source gas (step 1); removal of remaining gas by purge (step 2); changing the layers containing a metal element into metal oxide layers by supplying an oxidant (step 3); and removal of remaining gas by purge (step 4) are set as one cycle, and the cycle is performed at least once, preferably, a plurality of times, to form metal oxide films having a predetermined thickness on the substrates. In a modification process, while keeping the substrates under a heated condition at a pressure lower than atmospheric pressure, an oxygen-containing gas and a hydrogen-containing gas are supplied to the substrates on which the metal oxide films are formed, so as to modify the metal oxide films.

Figure 5:
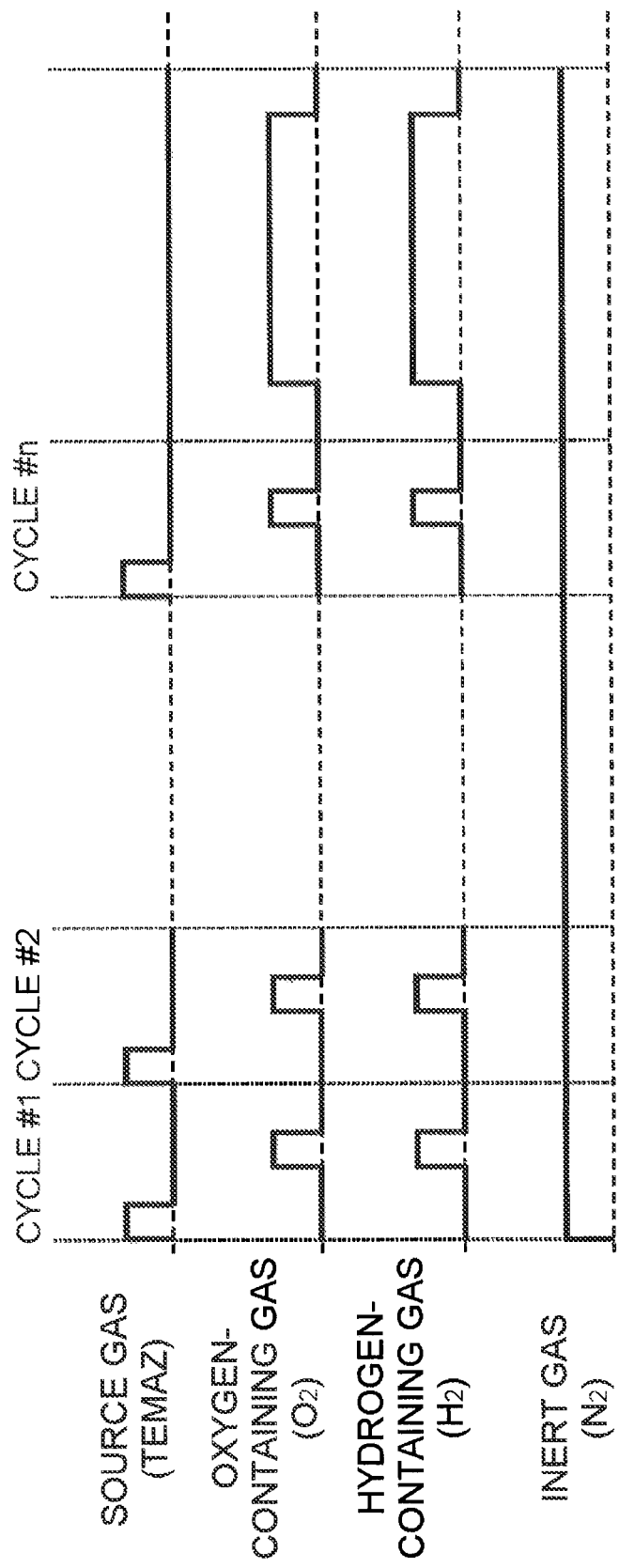
FIG. 5 is a view illustrating gas supply timing of a process sequence for an exemplary case of forming a zirconium oxide film on a substrate as a metal oxide film according to an embodiment of the present invention.

For example, zirconium oxide films ($ZrO_2$ films) may be formed on substrates as metal oxide films containing zirconium (Zr) in the following manner. In a film-forming process, formation of zirconium-containing layers on substrates by supplying a source gas (step 1); removal of remaining gas by purge (step 2); changing the zirconium-containing layers into zirconium oxide layers by supplying an oxidant (step 3); and removal of remaining gas by purge (step 4) are set as one cycle, and the cycle is performed at least once, preferably, a plurality of times, to form zirconium oxide films having a predetermined thickness on the substrates. In a modification process, while keeping the substrates under a heated condition at a pressure lower than atmospheric pressure, an oxygen-containing gas and a hydrogen-containing gas are supplied to the substrates on which the zirconium oxide films are formed, so as to modify the zirconium oxide films. In step 1, for example, TEMAZ (tetrakis(ethylmethylamino)zirconium: $Zr[N(C_2H_5)(CH_3)]_4$) gas may be used as the source gas. In step 3, an oxygen-containing gas and a hydrogen-containing gas may be used as the oxidant like in the above-described embodiment. Gases exemplified in the above-described embodiments may be used as the oxygen-containing gas and the hydrogen-containing gas. In addition, as the oxidant, an oxygen-containing gas such as $O_2$ gas, $O_3$ gas, or H$_2$O gas may be used alone, or an oxygen-containing gas activated by plasma may be used. For example, a gas obtained by activating O$_2$ gas by plasma may be used. In the modification process, gases exemplified in the above-described embodiments may be used as the oxygen-containing gas and the hydrogen-containing gas. In this case, the first gas supply system (source gas supply system) of the substrate processing apparatus of the above-described embodiment may be configured as a zirconium-containing gas supply system. Process conditions of the film-forming process and the modification process may be set within the process condition ranges of the above-described embodiment. In this case, gases may be supplied as shown in FIG. 5. FIG. 5 is a view illustrating gas supply timing of a process sequence for the case where the present invention is applied to formation of zirconium oxide films on substrates as metal oxide films. FIG. 5 illustrates an exemplary case where TEMAZ gas is used as a source gas, O$_2$ gas is used as an oxygen-containing gas, H$_2$ gas is used as a hydrogen-containing gas, and N$_2$ gas is used as a purge gas.

In addition, for example, hafnium oxide films (HfO$_2$ films) may be formed on substrates as metal oxide films containing hafnium (Hf) in the following manner. In a film-forming process, formation of hafnium-containing layers on substrates by supplying a source gas (step 1); removal of remaining gas by purge (step 2); changing the zirconium-containing layers into hafnium oxide layers by supplying an oxidant (step 3); and removal of remaining gas by purge (step 4) are set as one cycle, and the cycle is performed at least once, preferably, a plurality of times, to form hafnium oxide films having a predetermined thickness on the substrates. In a modification process, while keeping the substrates under a heated condition at a pressure lower than atmospheric pressure, an oxygen-containing gas and a hydrogen-containing gas are supplied to the substrates on which the hafnium oxide films are formed, so as to modify the hafnium oxide films. In step 1, TEMAH (tetrakis(ethylmethylamino)hafnium: Hf[N(C$_2$H$_5$)(CH$_3$)]$_4$) gas or TDMAH (tetrakis(dimethylamino)hafnium: Hf[N(CH$_3$)$_2$]$_4$) gas may be used as the source gas. In step 3, an oxygen-containing gas and a hydrogen-containing gas may be used as the oxidant like in the above-described embodiment. Gases exemplified in the above-described embodiments may be used as the oxygen-containing gas and the hydrogen-containing gas. In addition, as the oxidant, an oxygen-containing gas such as O$_2$ gas, O$_3$ gas, or H$_2$O gas may be used alone, or an oxygen-containing gas activated by plasma may be used. For example, a gas obtained by activating O$_2$ gas by plasma may be used. In the modification process, gases exemplified in the above-described embodiments may be used as the oxygen-containing gas and the hydrogen-containing gas. In this case, the first gas supply system (source gas supply system) of the substrate processing apparatus of the above-described embodiment may be configured as a hafnium-containing gas supply system. Process conditions of the film-forming process and the modification process may be set within the process condition ranges of the above-described embodiment.

In addition, for example, titanium oxide films (TiO$_2$ films) may be formed on substrates as metal oxide films containing titanium (Ti) in the following manner. In a film-forming process, formation of titanium-containing layers on substrates by supplying a source gas (step 1); removal of remaining gas by purge (step 2); changing the titanium-containing layers into titanium oxide layers by supplying an oxidant (step 3); and removal of remaining gas by purge (step 4) are set as one cycle, and the cycle is performed at least once, preferably, a plurality of times, to form titanium oxide films having a predetermined thickness on the substrates. In a modification process, while keeping the substrates under a heated condition at a pressure lower than atmospheric pressure, an oxygen-containing gas and a hydrogen-containing gas are supplied to the substrates on which the titanium oxide films are formed, so as to modify the titanium oxide films. In step 1, for example, TiCl$_4$ (titanium tetrachloride) gas or TDMAT (tetrakis(dimethylamino)titanium: Ti[N(CH$_3$)$_2$]$_4$) gas may be used as the source gas. In step 3, an oxygen-containing gas and a hydrogen-containing gas may be used as the oxidant like in the above-described embodiment. Gases exemplified in the above-described embodiments may be used as the oxygen-containing gas and the hydrogen-containing gas. In addition, as the oxidant, an oxygen-containing gas such as O$_2$ gas, O$_3$ gas, or H$_2$O gas may be used alone, or an oxygen-containing gas activated by plasma may be used. For example, a gas obtained by activating O$_2$ gas by plasma may be used. In the modification process, gases exemplified in the above-described embodiments may be used as the oxygen-containing gas and the hydrogen-containing gas. In this case, the first gas supply system (source gas supply system) of the substrate processing apparatus of the above-described embodiment may be configured as a titanium-containing gas supply system. Process conditions of the film-forming process and the modification process may be set within the process condition ranges of the above-described embodiment.

In addition, for example, aluminium oxide films (Al$_2$O$_3$ films) may be formed on substrates as metal oxide films containing aluminium (Al) in the following manner. In a film-forming process, formation of aluminium-containing layers on substrates by supplying a source gas (step 1); removal of remaining gas by purge (step 2); changing the aluminium-containing layers into aluminium oxide layers by supplying an oxidant (step 3); and removal of remaining gas by purge (step 4) are set as one cycle, and the cycle is performed at least once, preferably, a plurality of times, to form aluminium oxide films having a predetermined thickness on the substrates. In a modification process, while keeping the substrates under a heated condition at a pressure lower than atmospheric pressure, an oxygen-containing gas and a hydrogen-containing gas are supplied to the substrates on which the aluminium oxide films are formed, so as to modify the aluminium oxide films. In step 1, TMA (trimethyl-aluminium: Al(CH$_3$)$_3$) gas may be used as a source gas. In step 3, an oxygen-containing gas and a hydrogen-containing gas may be used as the oxidant like in the above-described embodiment. Gases exemplified in the above-described embodiments may be used as the oxygen-containing gas and the hydrogen-containing gas. In addition, as the oxidant, an oxygen-containing gas such as O$_2$ gas, O$_3$ gas, or H$_2$O gas may be used alone, or an oxygen-containing gas activated by plasma may be used. For example, a gas obtained by activating O$_2$ gas by plasma may be used. In the modification process, gases exemplified in the above-described embodiments may be used as the oxygen-containing gas and the hydrogen-containing gas. In this case, the first gas supply system (source gas supply system) of the substrate processing apparatus of the above-described embodiment may be configured as an aluminium-containing gas supply system. Process conditions of the film-forming process and the modification process may be set within the process condition ranges of the above-described embodiment.

It was ascertained that application of the present invention to formation of metal oxide films resulted in the same effects as those obtained in the case where the present invention was applied to formation of silicon oxide films. Impurity removing effects were ascertained as follows. When the present invention was applied to formation of silicon oxide films, impurity concentrations of the silicon oxide films, particularly, H concentration and Cl concentration were reduced, and when the present invention was applied to formation of metal oxide films, impurity concentrations of the metal oxide films, particularly, H concentration, Cl concentration, C concentration, and N concentration were reduced. In addition, silicon oxide films formed through the film-forming process of the current embodiment have very low impurity concentrations, particularly, C concentration and H concentration although the modification process is not performed. This may be because C and N are not included in the source gas.

As described above, the process sequence of the current embodiment can be applied to a process of forming a metal oxide (that is, a metal oxide film) such as a high permittivity insulating film (high-k film) on a substrate as well as a process of forming a silicon oxide film on a substrate. That is, the process sequence of the current embodiment can be applied to the case where a predetermined element included in an oxide film is a metal element as well as the case where the predetermined element is a semiconductor element.

In the film-forming process of the above-described embodiment, oxide films are cyclically formed by alternately repeating a process of supplying a source gas into the process vessel; and a process of supplying an oxygen-containing gas and a hydrogen-containing gas into the process vessel which is heated and kept at a pressure lower than atmospheric pressure. However, the present invention is not limited to the oxide film forming method. For example, a source gas and an oxygen-containing gas may be simultaneously supplied into the process vessel to form oxide films according to a general CVD or metal organic chemical vapor deposition (MOCVD) method. For example, $SiH_4$ gas and $O_2$ gas may be simultaneously supplied into the process vessel to form $SiO_2$ films (low temperature oxide (LTO) films) as oxide films by a CVD method. In addition, for example, TDMAH gas and $O_2$ gas may be simultaneously supplied into the process vessel to form $HfO_2$ films as oxide films by an MOCVD method. The same effects as those described above can be obtained by modifying the CVD/MOCVD oxide films formed in this way through the modification process of the above-described embodiment.

In the above-described embodiment, the film-forming process and the modification process are performed in the same process vessel. However, alternatively, the film-forming process and the modification process may be separately performed in different process vessels.

Figure 9:
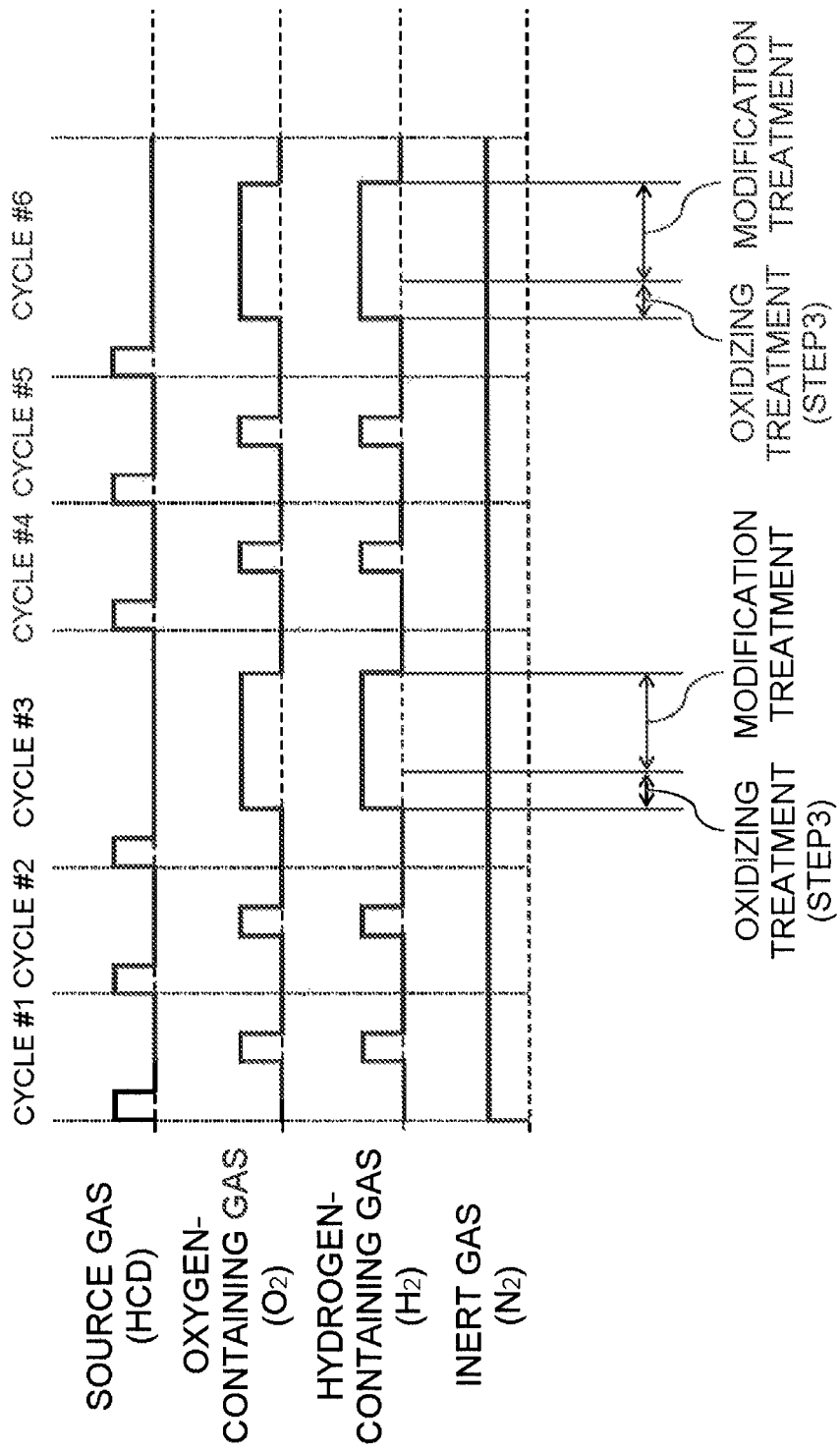
FIG. 9 is a view illustrating gas supply timing of a process sequence for an exemplary case where a modification process is performed during a film-forming process according to another embodiment of the present invention.

Furthermore, in the above-described embodiment, the modification process is performed after performing the film-forming process. However, alternatively, the modification process may be performed while the film-forming process is performed as shown in FIG. 9. That is, a film-forming process of forming silicon oxide films (silicon oxide layers) thinner than silicon oxide films to be finally formed, and a modification process may be alternately repeated. For example, a modification process may be performed each time a cycle of step 1 to step 4 is performed ten times in a film-forming process. In the example shown in FIG. 9, a modification process is performed each time a cycle of step 1 to step 4 is performed three times in a film-forming process. In the example show in FIG. 9, at each cycle where the modification process is performed (the third and sixth cycles), oxidizing treatment (step 3) to silicon-containing layers, and modification treatment to silicon oxide layers formed by that time are continuously performed. Alternatively, at each cycle where the modification process is performed, oxidizing treatment (step 3) to silicon-containing layers and modification treatment to silicon oxide layers formed by that time may be intermittently performed by inserting a purge process between the oxidizing treatment and the modification treatment.

In this way, a film-forming process of forming silicon oxide films (silicon oxide layers) thinner than silicon oxide films to be finally formed, and a modification process are alternately repeated. That is, the modification process can be performed to silicon oxide layers having a relatively thin thickness, and thus the effect of removing impurities from films can be further improved. This method is particularly effective for the case of forming silicon oxide films the final thickness of which is relatively large in the range of 200 Å to 300 Å or more.

EXAMPLES

First Example

Next, a first example will be described.

$SiO_2$ films were formed on wafers at 450° C. and 600° C. through the film-forming process of the above-described embodiment. Thereafter, some of the $SiO_2$ films formed at 450° C. were modified at 450° C. and 600° C. under a depressurized condition by using $O_2$ gas and $H_2$ gas (the modification treatment of the above-described embodiment), and the other of the $SiO_2$ films formed on the wafers at 450° C. were annealed at 450° C. and 600° C. under atmospheric pressure by using $N_2$ gas (modification treatment of comparative example). Before and after the modification treatments, the $SiO_2$ films were etched by using a 1% hydrofluoric acid (HF) solution, and wafer etching rates (hereinafter also referred as WERs) of the $SiO_2$ films were measured. Specifically, the following six evaluation samples were prepared, and the WERs of $SiO_2$ films of the evaluation samples were measured by using a 1% HF solution. Except for temperature conditions (wafer temperature conditions), other process conditions used for preparing the evaluation samples were set in the process condition ranges described in the above embodiment.

(A) Evaluation sample prepared by forming a $SiO_2$ film at 600° C. through the film-forming process of the embodiment of the present invention.

(B) Evaluation sample prepared by forming a $SiO_2$ film at 450° C. through the film-forming process of the embodiment of the present invention.

(C) Evaluation sample prepared by: forming a $SiO_2$ film at 450° C. through the film-forming process of the embodiment of the present invention, and annealing the $SiO_2$ film by using $N_2$ under atmospheric pressure at 600° C. higher than the film-forming temperature (modification treatment of comparative example).

(D) Evaluation sample prepared by: forming a $SiO_2$ film at 450° C. through the film-forming process of the embodiment of the present invention, and modifying the $SiO_2$ film by $O_2$ gas and $H_2$ gas under a depressurized condition at 600° C. higher than the film-forming temperature (modification treatment of the embodiment of the present invention).

(E) Evaluation sample prepared by: forming a $SiO_2$ film at 450° C. through the film-forming process of the embodiment of the present invention, and annealing the $SiO_2$ film by using $N_2$ under atmospheric pressure at 450° C. equal to the film-forming temperature (modification treatment of comparative example).

(F) Evaluation sample prepared by: forming a $SiO_2$ film at 450° C. through the film-forming process of the embodiment of the present invention, and modifying the $SiO_2$ film by $O_2$ gas and $H_2$ gas under a depressurized condition at 450° C.

equal to the film-forming temperature (modification treatment of the embodiment of the present invention).

Figure 6:
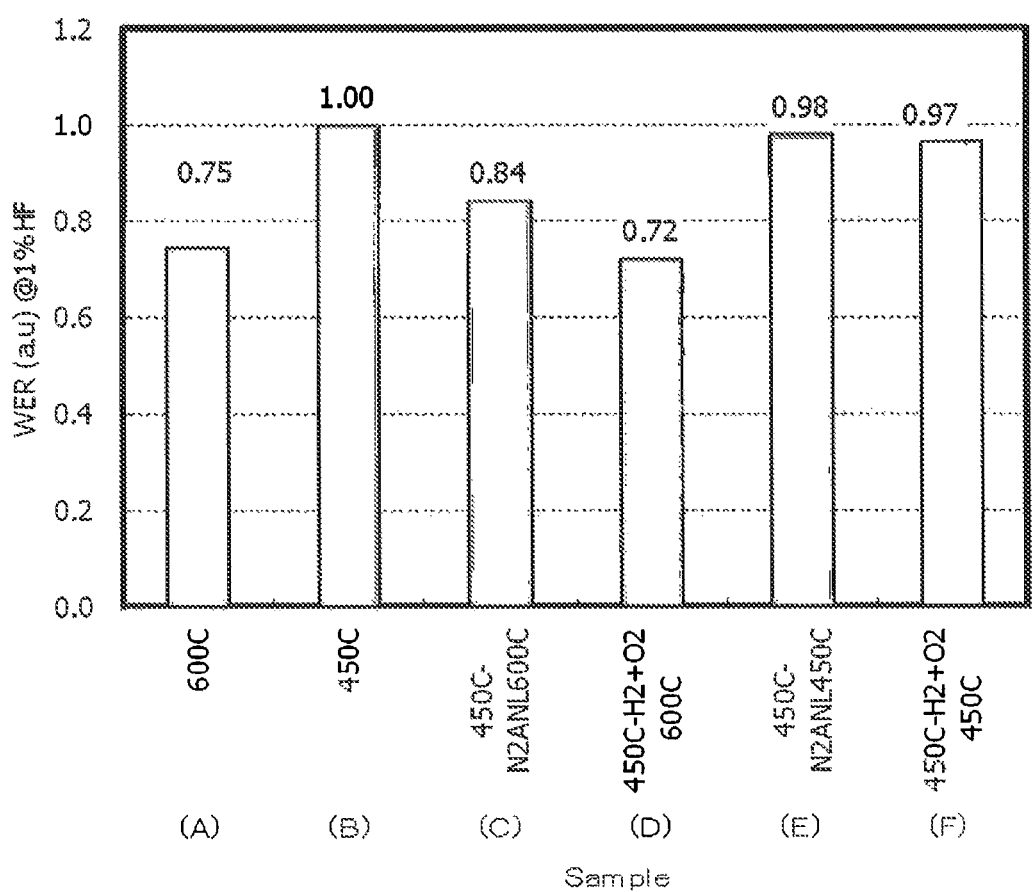
FIG. 6 is a view illustrating wafer etching rates of silicon oxide films before and after modification treatments are performed to the silicon oxide films formed in a film-forming process of an embodiment of the present invention.

The results are shown in FIG. 6. FIG. 6 is a view showing the relationship between main process conditions of the evaluation samples and wafer etching rates (WERs) of the $SiO_2$ films of the evaluation samples. In FIG. 6, the horizontal axis denotes main process conditions of the evaluation samples, and the vertical axis denotes WERs of the $SiO_2$ films of the evaluation samples. In FIG. 6, relative WERs are shown based on WER of the $SiO_2$ film of the evaluation sample (B) formed at 450° C. (that is, relatively WERs when the WER of the $SiO_2$ film of the evaluation sample (B) is 1). In the current example, film quality is evaluated by WERs. That is, in the current example, it is determined that a lower WER means better film quality. Herein, a good-quality film means a dense film having low impurity concentrations. For example, in the case where a large amount of impurity such as Cl is contained in a film, since the impurity such as Cl is easily ionized by an HF solution, the WER of the film is high. However, in the case where a small amount of impurity such as Cl is contained in a film, the WER of the film is low. Although it is assumed that the same molecular amounts of dense and rough films are dissolved per unit time when the dense and rough films are immersed in an HF solution, since the molecular density of the dense film is greater than the rough film, the dense film is less reduced in thickness, and thus the WER of the dense film is low. Therefore, it can be considered that a film having a low WER is a high-quality film which is dense and has less impurity.

As shown in FIG. 6, the WER of the $SiO_2$ film of the evaluation sample (A) formed at 600° C. is 0.75 which is lower than the WER of the $SiO_2$ film of the evaluation sample (B) formed at 450° C. Thus, the $SiO_2$ film of the evaluation sample (A) may be considered to be satisfactory in quality. The WER of the $SiO_2$ film of the evaluation sample (C) formed at 450° C. and annealed by $N_2$ at 600° C. is 0.84 which is lower than the WER of the $SiO_2$ film of the evaluation sample (B) formed at 450° C. and not annealed by $N_2$. That is, it can be understood that the quality of the $SiO_2$ film of the evaluation sample (C) is improved. In addition, the WER of the $SiO_2$ film of the evaluation sample (D), which is formed at 450° C. and modified at 600° C. under a depressurized condition by using $O_2$ gas+$H_2$ gas, is further reduced to 0.72. That is, it can be understood that the quality of the $SiO_2$ film of the evaluation sample (D) is further improved. In addition, the WER of the $SiO_2$ film of the evaluation sample (D) is lower than the WER of the $SiO_2$ film of the evaluation sample (A) formed at 600° C. That is, it can be understood that the quality of the $SiO_2$ film of the evaluation sample (D) is most improved. The $N_2$ annealing of the evaluation sample (C), and the modification treatment of the evaluation sample (D) under a depressurized condition using $O_2$ gas+$H_2$ gas were performed for the same process time (process times were set to be equal), but it could be understood that the film quality improvement effect was greater in the case of the modification treatment performed under a depressurized condition using $O_2$ gas+$H_2$ gas than in the case of the $N_2$ annealing. That is, a dense film having less impurity could be obtained in the case of the modification treatment performed under a depressurized condition using $O_2$ gas and $H_2$ gas rather than in the case of the $N_2$ annealing.

As it can be understood from FIG. 6, if an oxide film is formed at a relatively high temperature, the impurity concentration of the oxide film can be reduced. However, in a high temperature region, a source gas is thermally decomposed and an etching action is caused by HCl and $Cl_2$ generated from the source gas. Therefore, it is difficult to ensure the in-surface thickness uniformity of an oxide film. However, if an oxide film is formed at a relatively low temperature, the in-surface thickness uniformity of the oxide film can be satisfactory. However, if an oxide film is formed at a low temperature, the impurity concentration of the oxide film is high. However, according to the present invention, an oxide film is formed at a relatively low temperature for good in-surface film thickness uniformity, and then a modification treatment is performed at a relatively high temperature under a depressurized condition by using $O_2$ gas+$H_2$ gas, so as to remove a disadvantage of the oxide film formed at a low temperature (a relatively large amount of impurity in the oxide film). Thus, the quality of the oxide film can be satisfactory. In addition, owing to the oxide film having satisfactory quality, electric characteristics can be improved.'

Furthermore, in the evaluation sample (E) formed at 450° C. and annealed by $N_2$ at 450° C., the WER of the $SiO_2$ film is improved to 0.98 although the improvement is small. In addition, the WER of the $SiO_2$ film of the evaluation sample (F), which is formed at 450° C. and modified at 450° C. under a depressurized condition by using $O_2$ gas+$H_2$ gas, is improved to 0.97 although the improvement is small. That is, although an $N_2$ annealing treatment or a modification treatment under a depressurized condition using $O_2$ gas+$H_2$ gas is performed at the same temperature as the temperature of a film-forming process, film quality can be improved. For example, by performing the modification treatment for a longer time, the same effects can be obtained as the effects that can be obtained by performing an $N_2$ annealing treatment at a temperature higher than the temperature of a film-forming process or a modification treatment under a depressurized condition using $O_2$ gas+$H_2$ gas at a temperature higher than the temperature of a film-forming process. At this time, that is, when an $N_2$ annealing treatment or a modification treatment under a depressurized condition using $O_2$ gas+$H_2$ gas is performed at the same temperature as the temperature of a film-forming process, more film quality improvement effect can be obtained in the case of the modification treatment under a depressurized condition using $O_2$ gas+$H_2$ gas than in the case of the $N_2$ annealing treatment.

That is, film quality improvement effect is greater in the case of performing a modification treatment to an oxide film under a depressurized condition using $O_2$ gas+$H_2$ gas at a temperature equal to or higher than the temperature of a film-forming process, than in the case of performing an $N_2$ annealing treatment to the oxide film at the same temperature as the modification treatment. Sometimes the thickness of a film was slightly increased after a modification treatment was performed under a depressurized condition using $O_2$ gas+$H_2$ gas. However, the amount of such film thickness increase could be kept close to zero by controlling process conditions of the modification treatment. That is, by controlling process conditions of a modification treatment, an underlayer material could be minimally consumed.

Second Example

Next, a second example will be described.

$SiO_2$ films were formed on wafers at 450° C., 600° C., and 700° C. through the film-forming process of the above-described embodiment. Thereafter, the $SiO_2$ films formed at 450° C. and 600° C. were modified at 700° C. under a depressurized condition by using $O_2$ gas and $H_2$ gas (the modification treatment of the above-described embodiment) for 60 minutes. Before and after the modification treatment, impurity concentrations (H, Cl) of the $SiO_2$ films were measured. Specifically, the following five evaluation samples were prepared, and impurity concentrations (H, Cl) of $SiO_2$ films of the evaluation samples were measured. Except for temperature conditions (wafer temperature conditions), other process conditions used for preparing the evaluation samples were set in the process condition ranges described in the above embodiment. In addition, the impurity concentrations of the films were measured by a secondary ion mass spectrometer (SIMS).

(A) Evaluation sample prepared by forming a $SiO_2$ film at 450° C. through the film-forming process of the embodiment of the present invention.

(B) Evaluation sample prepared by forming a $SiO_2$ film at 600° C. through the film-forming process of the embodiment of the present invention.

(C) Evaluation sample prepared by forming a $SiO_2$ film at 700° C. through the film-forming process of the embodiment of the present invention.

(D) Evaluation sample prepared by: forming a $SiO_2$ film at 450° C. through the film-forming process of the embodiment of the present invention, and modifying the $SiO_2$ film by $O_2$ gas and $H_2$ gas under a depressurized condition at 700° C. higher than the film-forming temperature (modification treatment of the embodiment of the present invention).

(E) Evaluation sample prepared by: forming a $SiO_2$ film at 600° C. through the film-forming process of the embodiment of the present invention, and modifying the $SiO_2$ film by $O_2$ gas and $H_2$ gas under a depressurized condition at 700° C. higher than the film-forming temperature (modification treatment of the embodiment of the present invention).

Figure 7:
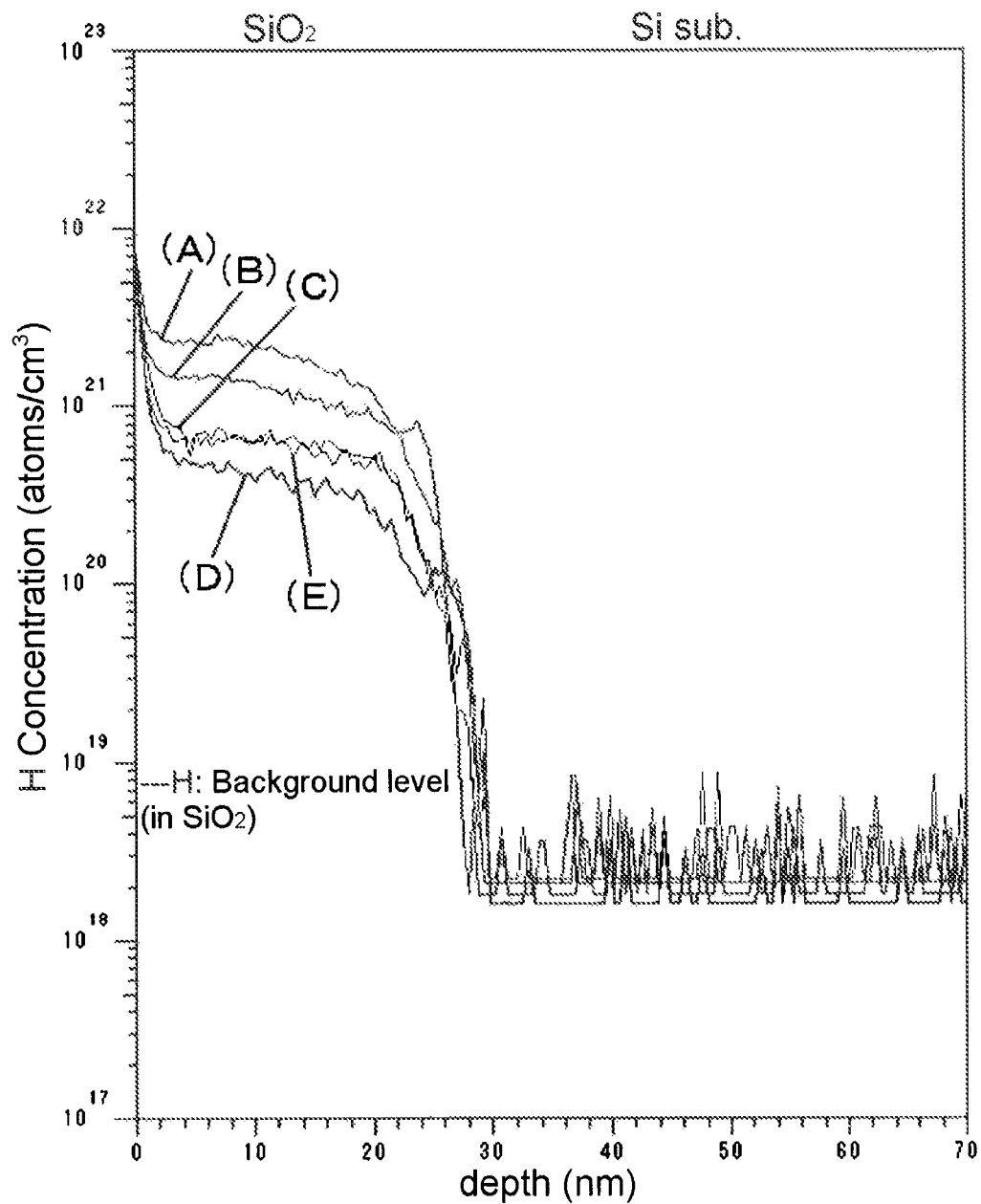
FIG. 7 is a view illustrating the concentration of an impurity (H) in a silicon oxide film formed in a process sequence according to an embodiment of the present invention.
Figure 8:
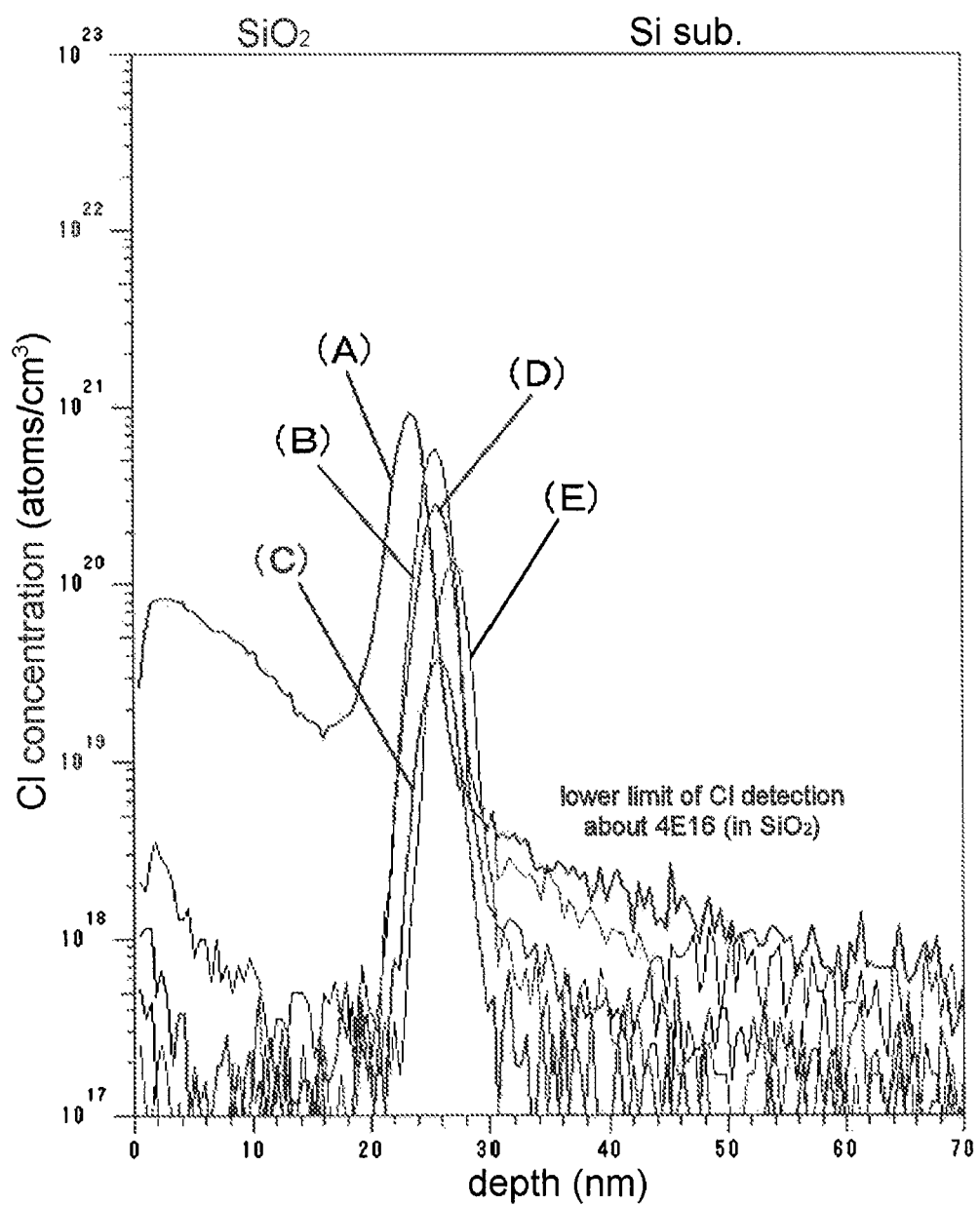
FIG. 8 is a view illustrating the concentration of an impurity (Cl) in a silicon oxide film formed in a process sequence according to an embodiment of the present invention.

The results are shown in FIG. 7 and FIG. 8. FIG. 7 shows the impurity (H) concentrations of the $SiO_2$ films of the evaluation samples. FIG. 8 shows the impurity (Cl) concentrations of the $SiO_2$ films of the evaluation samples. In FIG. 7 and FIG. 8, the horizontal axes denote the depth (nm) from a surface of a $SiO_2$ film, and the vertical axes denote impurity (H, Cl) concentrations (atoms/cm$^3$).

Referring to FIG. 7 and FIG. 8, the H concentration and Cl concentration of the $SiO_2$ film of the evaluation sample (D) formed at 450° C. and modified at 700° C. are much lower than the H concentration and Cl concentration of the $SiO_2$ film of the evaluation sample (A) formed at 450° C. but not modified. That is, it can be understood that the quality of the $SiO_2$ film of the evaluation sample (D) is largely improved. In addition, the H concentration and Cl concentration of the (E) formed at 600° C. and modified at 700° C. are much lower than the H concentration and Cl concentration of the $SiO_2$ film of the evaluation sample (B) formed at 600° C. but not modified. That is, it can be understood that the quality of the $SiO_2$ film of the evaluation sample (E) is largely improved. In addition, as shown in FIG. 7, although the H concentration of the $SiO_2$ film of the evaluation sample (E) formed at 600° C. and modified at 700° C. is similar to the H concentration of the $SiO_2$ film of the evaluation sample (C) formed at 700° C., the H concentration of the $SiO_2$ film of the evaluation sample (D) formed at 450° C. and modified at 700° C. is lower than the H concentration of the evaluation sample (C) formed at 700° C. The H concentration of the evaluation sample (D) is lowest.

According to the present invention, the quality of an oxide film can be improved while avoiding risks of a high temperature oxide film forming process, to improve electric characteristics. In addition, when an oxide film is formed, consumption of an under-layer material can be minimized to make the oxide film suitable for constructing a fine structure.

The present invention also includes the following preferred embodiments.

According to an embodiment of the present invention, there is provided a method of manufacturing a semiconductor device, including:

(a) forming an oxide film having a predetermined thickness on a substrate by alternately repeating: (a-1) forming a layer containing a predetermined element on the substrate by supplying a source gas containing the predetermined element into a process vessel accommodating the substrate and exhausting the source gas from the process vessel; and (a-2) changing the layer containing the predetermined element into an oxide layer by supplying an oxygen-containing gas and an hydrogen-containing gas into the process vessel, wherein an inside of the process vessel is under a heated atmosphere having a pressure lower than an atmospheric pressure, and exhausting the oxygen-containing gas and the hydrogen-containing gas from the process vessel; and (b) modifying the oxide film formed on the substrate by supplying the oxygen-containing gas and the hydrogen-containing gas into the process vessel, wherein the inside of the process vessel is under the heated atmosphere having the pressure lower than the atmospheric pressure, and exhausting the oxygen-containing gas and the hydrogen-containing gas from the process vessel.

Preferably, a temperature of the substrate in the step (b) is higher than a temperature of the substrate in the step (a-2); or a gas supply time of each of the gases in the step (b) is longer than a gas supply time of each of the gases in the step (a-2).

Preferably, a temperature of the substrate in the step (b) is higher than a temperature of the substrate in the step (a).

Preferably, the step (a) and the step (b) are alternately repeated.

Preferably, in the step (a-2), the oxygen-containing gas is reacted with the hydrogen-containing gas under the heated atmosphere having the pressure lower than the atmospheric pressure to form an oxidizing species, and the layer containing the predetermined element is changed into the oxide layer by using the oxidizing species, and in the step (b), the oxygen-containing gas is reacted with the hydrogen-containing gas under the heated atmosphere having the pressure lower than the atmospheric pressure to form the oxidizing species, and the oxide film is modified using the oxidizing species.

According to another embodiment of the present invention, there is provided a method of manufacturing a semiconductor device, including:

(a) forming a silicon oxide film having a predetermined thickness on a substrate by alternately repeating: (a-1) forming a silicon-containing layer on the substrate by supplying a source gas containing a silicon into a process vessel accommodating the substrate and exhausting the source gas from the process vessel; and (a-2) changing the silicon-containing layer into a silicon oxide layer by supplying an oxygen-containing gas and an hydrogen-containing gas into the process vessel, wherein an inside of the process vessel is under a heated atmosphere having a pressure lower than an atmospheric pressure, and exhausting the oxygen-containing gas and the hydrogen-containing gas from the process vessel; and (b) modifying the oxide film formed on the substrate by supplying the oxygen-containing gas and the hydrogen-containing gas into the process vessel, wherein the inside of the process vessel is under the heated atmosphere having the pressure lower than the atmospheric pressure, and exhausting the oxygen-containing gas and the hydrogen-containing gas from the process vessel.

Preferably, a temperature of the substrate in the step (b) is higher than a temperature of the substrate in the step (a-2); or a gas supply time of each of the gases in the step (b) is longer than a gas supply time of each of the gases in the step (a-2).

Preferably, a temperature of the substrate in the step (b) is higher than a temperature of the substrate in the step (a).

Preferably, the step (a) and the step (b) are alternately repeated.

Preferably, in the step (a-2), the oxygen-containing gas is reacted with the hydrogen-containing gas under the heated atmosphere having the pressure lower than the atmospheric pressure to form an oxidizing species, and the silicon-containing layer is changed into the silicon oxide layer by using the oxidizing species, and in the step (b), the oxygen-containing gas is reacted with the hydrogen-containing gas under the heated atmosphere having the pressure lower than the atmospheric pressure to form the oxidizing species, and the silicon oxide film is modified using the oxidizing species.

According to another embodiment of the present invention, there is provided a substrate processing apparatus including:

a process vessel configured to accommodate a substrate;
a heater configured to heat an inside of the process vessel;
a source gas supply system configured to supply a source gas containing a predetermined element into the process vessel;
an oxygen-containing gas supply system configured to supply an oxygen-containing gas into the process vessel;
a hydrogen-containing gas supply system configured to supply a hydrogen-containing gas into the process vessel;
an exhaust system configured to exhaust the inside of the process vessel;
a pressure regulator configured to control pressure of the inside of the process vessel; and
a controller configured to control the heater, the source gas supply system, the oxygen-containing gas supply system, the hydrogen-containing gas supply system, the exhaust system, and the pressure regulator so as to perform:

(a) forming an oxide film having a predetermined thickness on the substrate by alternately repeating: (a-1) forming a layer containing the predetermined element on the substrate by supplying the source gas into a process vessel accommodating the substrate and exhausting the source gas from the process vessel; and (a-2) changing the layer containing the predetermined element into an oxide layer by supplying an oxygen-containing gas and an hydrogen-containing gas into the process vessel, wherein the inside of the process vessel is under a heated atmosphere having a pressure lower than an atmospheric pressure, and exhausting the oxygen-containing gas and the hydrogen-containing gas from the process vessel; and (b) modifying the oxide film formed on the substrate by supplying the oxygen-containing gas and the hydrogen-containing gas into the process vessel, wherein the inside of the process vessel is under the heated atmosphere having the pressure lower than the atmospheric pressure, and exhausting the oxygen-containing gas and the hydrogen-containing gas from the process vessel.

According to another embodiment of the present invention, there is provided a substrate processing apparatus including:

a process vessel configured to accommodate a substrate;
a heater configured to heat an inside of the process vessel;
a source gas supply system configured to supply a source gas containing a silicon into the process vessel;
an oxygen-containing gas supply system configured to supply an oxygen-containing gas into the process vessel;
a hydrogen-containing gas supply system configured to supply a hydrogen-containing gas into the process vessel;
an exhaust system configured to exhaust the inside of the process vessel;
a pressure regulator configured to control pressure of the inside of the process vessel; and
a controller configured to control the heater, the source gas supply system, the oxygen-containing gas supply system, the hydrogen-containing gas supply system, the exhaust system, and the pressure regulator so as to perform:

(a) forming an silicon oxide film having a predetermined thickness on the substrate by alternately repeating: (a-1) forming the silicon-containing layer on the substrate by supplying the source gas into a process vessel accommodating the substrate and exhausting the source gas from the process vessel; and (a-2) changing the layer containing the predetermined element into an silicon oxide layer by supplying an oxygen-containing gas and an hydrogen-containing gas into the process vessel, wherein the inside of the process vessel is under a heated atmosphere having a pressure lower than an atmospheric pressure, and exhausting the oxygen-containing gas and the hydrogen-containing gas from the process vessel; and (b) modifying the silicon oxide film formed on the substrate by supplying the oxygen-containing gas and the hydrogen-containing gas into the process vessel, wherein the inside of the process vessel is under the heated atmosphere having the pressure lower than the atmospheric pressure, and exhausting the oxygen-containing gas and the hydrogen-containing gas from the process vessel.

What is claimed is:

1. A substrate processing apparatus comprising:
a process vessel configured to accommodate a substrate;
a heater configured to heat a substrate in the process vessel;
a source gas supply system configured to supply a source gas containing a predetermined element into the process vessel;
an oxygen-containing gas supply system configured to supply an oxygen-containing gas into the process vessel;
a hydrogen-containing gas supply system configured to supply a hydrogen-containing gas into the process vessel;
a pressure regulator configured to control a pressure of an inside of the process vessel; and
a controller configured to control the heater, the source gas supply system, the oxygen-containing gas supply system, the hydrogen-containing gas supply system, and the pressure regulator so as to perform: (a) forming an oxide film on the substrate by alternately repeating: (a-1) forming a layer containing the predetermined element by supplying the source gas into the process vessel accommodating the substrate; and (a-2) changing the layer containing the predetermined element into an oxide layer by supplying the oxygen-containing gas and the hydrogen-containing gas into the process vessel, the inside of the process vessel being under a heated atmosphere having a pressure lower than an atmospheric pressure; and (b) modifying the oxide film formed on the substrate by supplying the oxygen-containing gas and the hydrogen-containing gas into the process vessel, the inside of the process vessel being under the heated atmosphere having the pressure lower than the atmospheric pressure.

2. The substrate processing apparatus according to claim 1, wherein the controller is configured to further control the heater, the oxygen-containing gas supply system, and the hydrogen-containing gas supply system so that a temperature of the substrate in the step (b) is higher than a temperature of the substrate in the step (a-2); or a gas supply time of each of the gases in the step (b) is longer than a gas supply time of each of the gases in the step (a-2).

3. The substrate processing apparatus according to claim 1, wherein the controller is configured to further control the heater so that a temperature of the substrate in the step (b) is higher than a temperature of the substrate in the step (a).

4. The substrate processing apparatus according to claim 1, wherein the controller is configured to further control the heater, the source gas supply system, the oxygen-containing gas supply system, the hydrogen-containing gas supply system, and the pressure regulator so that the step (a) and the step (b) are alternately repeated.

5. The substrate processing apparatus according to claim 1, wherein the controller is configured to further control the heater, the source gas supply system, the oxygen-containing gas supply system, the hydrogen-containing gas supply system, and the pressure regulator so that the oxygen-containing gas is reacted with the hydrogen-containing gas under the heated atmosphere having the pressure lower than the atmospheric pressure to form an oxidizing species, and the layer containing the predetermined element is changed into the oxide layer by using the oxidizing species in the step (a-2), and the oxygen-containing gas is reacted with the hydrogen-containing gas under the heated atmosphere having the pressure lower than the atmospheric pressure to form the oxidizing species, and the oxide film is modified by using the oxidizing species in the step (b).

6. The substrate processing apparatus according to claim 1, wherein the predetermined element comprises at least one of a semiconductor element and a metal element.

7. The substrate processing apparatus according to claim 1, wherein the predetermined element comprises at least one of a silicon element and a metal element.

8. The substrate processing apparatus according to claim 1, wherein the predetermined element comprises a silicon element.

9. A substrate processing apparatus comprising:
a process vessel configured to accommodate a substrate;
a heater configured to heat a substrate in the process vessel;
a source gas supply system configured to supply a source gas containing a predetermined element into the process vessel;
an oxygen-containing gas supply system configured to supply an oxygen-containing gas into the process vessel;
a hydrogen-containing gas supply system configured to supply a hydrogen-containing gas into the process vessel;
a pressure regulator configured to control a pressure of an inside of the process vessel; and
a controller configured to control the heater, the source gas supply system, the oxygen-containing gas supply system, the hydrogen-containing gas supply system, and the pressure regulator so as to perform: (a) forming an oxide film on the substrate by alternately repeating: (a-1) supplying the source gas into the process vessel accommodating the substrate to form a layer containing the predetermined element; and (a-2) supplying the oxygen-containing gas and the hydrogen-containing gas into the process vessel to change the layer containing the predetermined element into an oxide layer, the inside of the process vessel being under a heated atmosphere having a pressure lower than an atmospheric pressure; and after that, (b) supplying the oxygen-containing gas and the hydrogen-containing gas into the process vessel, the inside of the process vessel being under the heated atmosphere having the pressure lower than the atmospheric pressure.

10. A substrate processing apparatus comprising:
a process vessel configured to accommodate a substrate;
a heater configured to heat a substrate in the process vessel;
a source gas supply system configured to supply a source gas containing a predetermined element into the process vessel;
an oxygen-containing gas supply system configured to supply an oxygen-containing gas into the process vessel;
a hydrogen-containing gas supply system configured to supply a hydrogen-containing gas into the process vessel;
a pressure regulator configured to control a pressure of an inside of the process vessel; and
a controller configured to control the heater, the source gas supply system, the oxygen-containing gas supply system, the hydrogen-containing gas supply system, and the pressure regulator so as to perform: alternately repeating: (a-1) supplying the source gas into the process vessel accommodating the substrate; and (a-2) supplying the oxygen-containing gas and the hydrogen-containing gas into the process vessel, the inside of the process vessel being under a heated atmosphere having a pressure lower than an atmospheric pressure; and after that, (b) supplying the oxygen-containing gas and the hydrogen-containing gas into the process vessel, the inside of the process vessel being under the heated atmosphere having the pressure lower than the atmospheric pressure.

* * * * *